(12) United States Patent
Anderson et al.

(10) Patent No.: US 8,809,954 B2
(45) Date of Patent: Aug. 19, 2014

(54) PARTIALLY DEPLETED (PD) SEMICONDUCTOR-ON-INSULATOR (SOI) FIELD EFFECT TRANSISTOR (FET) STRUCTURE WITH A GATE-TO-BODY TUNNEL CURRENT REGION FOR THRESHOLD VOLTAGE (VT) LOWERING AND METHOD OF FORMING THE STRUCTURE

(71) Applicant: International Business Machines Corporation, Armonk, NY (US)

(72) Inventors: Brent A. Anderson, Jericho, VT (US); Andres Bryant, Burlington, VT (US); Jiale Liang, Stanford, CA (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/146,869

(22) Filed: Jan. 3, 2014

(65) Prior Publication Data
US 2014/0117450 A1 May 1, 2014

Related U.S. Application Data

(62) Division of application No. 12/967,329, filed on Dec. 14, 2010, now Pat. No. 8,698,245.

(51) Int. Cl.
*H01L 27/12* (2006.01)
*H01L 21/00* (2006.01)
*H01L 21/84* (2006.01)

(52) U.S. Cl.
USPC ............. 257/348; 257/E29.263; 438/151

(58) Field of Classification Search
USPC .................................. 257/E29.263
See application file for complete search history.

(56) References Cited

U.S. PATENT DOCUMENTS

| 3,855,610 A | 12/1974 | Nagata et al. |
| 4,259,683 A | 3/1981 | Adler et al. |

(Continued)

FOREIGN PATENT DOCUMENTS

| JP | 59-181063 A | 10/1984 |
| JP | 07-094733 A | 9/1993 |
| JP | 2004-303911 | 10/2004 |

OTHER PUBLICATIONS

U.S. Appl. No. 12/967,329, filed Dec. 14, 2010, IBM, Office Action Communication, Dated Apr. 15, 2013, 6 pages.

(Continued)

*Primary Examiner* — Daniel Luke
(74) *Attorney, Agent, or Firm* — Gibb & Riley, LLC

(57) ABSTRACT

Disclosed are embodiments of a field effect transistor with a gate-to-body tunnel current region (GTBTCR) and a method. In one embodiment, a gate, having adjacent sections with different conductivity types, traverses the center portion of a semiconductor layer to create, within the center portion, a channel region and a GTBTCR below the adjacent sections having the different conductivity types, respectively. In another embodiment, a semiconductor layer has a center portion with a channel region and a GTBTCR. The GTBTCR comprises: a first implant region adjacent to and doped with a higher concentration of the same first conductivity type dopant as the channel region; a second implant region, having a second conductivity type, adjacent to the first implant region; and an enhanced generation and recombination region between the implant regions. A gate with the second conductivity type traverses the center portion.

20 Claims, 14 Drawing Sheets

(56) References Cited

U.S. PATENT DOCUMENTS

| | | | |
|---|---|---|---|
| 4,962,409 A | 10/1990 | Solomon | |
| 5,559,368 A | 9/1996 | Hu et al. | |
| 5,753,955 A | 5/1998 | Fechner | |
| 5,767,549 A | 6/1998 | Chen et al. | |
| 5,937,303 A | 8/1999 | Gardner et al. | |
| 5,998,848 A | 12/1999 | Brown et al. | |
| 6,020,222 A | 2/2000 | Wollesen | |
| 6,049,110 A | 4/2000 | Koh | |
| 6,097,069 A | 8/2000 | Brown et al. | |
| 6,100,143 A | 8/2000 | Brown et al. | |
| 6,239,649 B1 | 5/2001 | Bertin et al. | |
| 6,249,027 B1 | 6/2001 | Burr | |
| 6,261,886 B1 | 7/2001 | Houston | |
| 6,320,225 B1 | 11/2001 | Hargrove et al. | |
| 6,424,016 B1 | 7/2002 | Houston | |
| 6,465,849 B1 | 10/2002 | Chang et al. | |
| 6,512,244 B1 | 1/2003 | Ju et al. | |
| 6,521,948 B2 | 2/2003 | Ebina | |
| 6,528,851 B1 | 3/2003 | Yu | |
| 6,646,305 B2 | 11/2003 | Assaderaghi et al. | |
| 6,653,698 B2 | 11/2003 | Lee et al. | |
| 6,693,328 B1 | 2/2004 | Kawanaka et al. | |
| 6,830,953 B1 | 12/2004 | Hu et al. | |
| 6,949,769 B2 | 9/2005 | Hu et al. | |
| 7,011,980 B1 | 3/2006 | Na et al. | |
| 7,084,024 B2 | 8/2006 | Gluschenkov et al. | |
| 7,151,023 B1 | 12/2006 | Nayfeh et al. | |
| 7,691,702 B2 | 4/2010 | Kapoor | |
| 7,820,530 B2 | 10/2010 | Min et al. | |
| 2001/0002058 A1 | 5/2001 | Nakamura et al. | |
| 2003/0068874 A1 | 4/2003 | Jung et al. | |
| 2003/0122214 A1 | 7/2003 | Yang et al. | |
| 2005/0040404 A1 | 2/2005 | Hu et al. | |
| 2005/0072975 A1 | 4/2005 | Chen et al. | |
| 2006/0071282 A1 | 4/2006 | Kadoshima et al. | |
| 2008/0054310 A1 | 3/2008 | Guegan | |
| 2009/0242985 A1 | 10/2009 | Anderson et al. | |
| 2009/0243029 A1 | 10/2009 | Anderson et al. | |
| 2010/0038728 A1 | 2/2010 | Anderson et al. | |
| 2010/0155842 A1* | 6/2010 | Anderson et al. | 257/347 |

OTHER PUBLICATIONS

U.S. Appl. No. 12/967,329, filed Dec. 14, 2010, IBM, Office Action Communication, Dated Jun. 3, 2013, 13 pages.

U.S. Appl. No. 12/967,329, filed Dec. 14, 2010, IBM, Notice of Allowance Communication, Dated Nov. 1, 2013, 13 pages.

R.V. Joshi et al., "PD/SOI SRAM performance in presence of gate-to-body tunneling current," IEEE Trans. on VLSI Systems, vol. 11, No. 6, Dec. 2003, pp. 1106-1113.

R. Kanj et al., "Design Considerations for PD/SOI SRAM: Impace of Gate Leakage and Threshold Voltage Variation," IEEE Trans. on Semiconductor Manufacturing, Val. 21, No. 1, pp. 33-44, published Feb. 2008.

\* cited by examiner

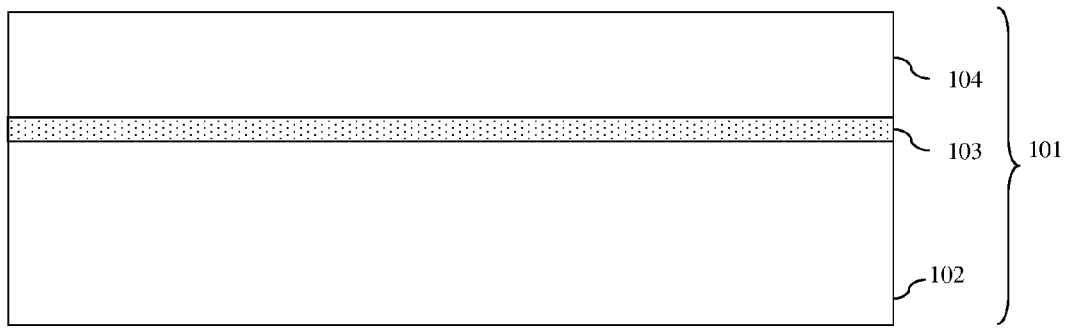
Figure 6
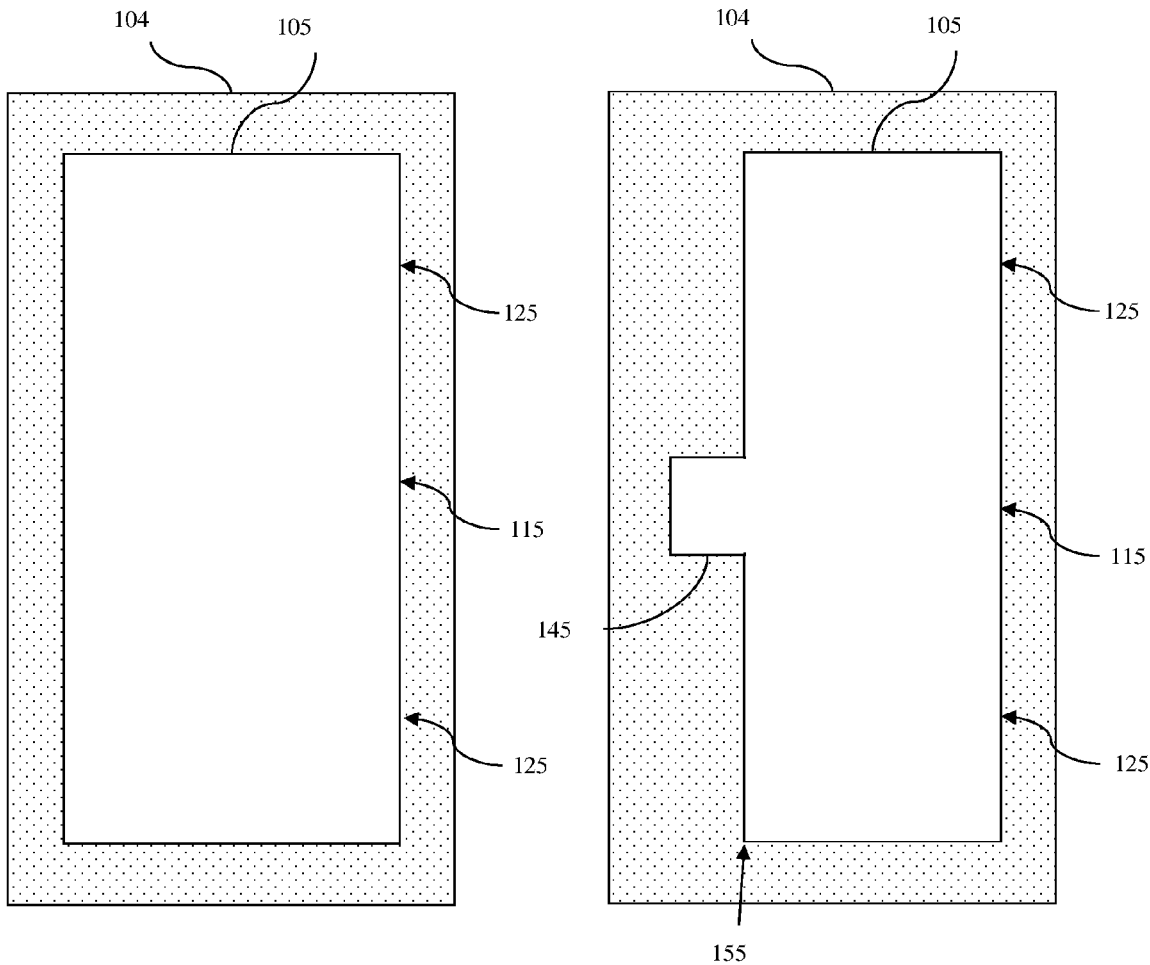
Figure 7A
Figure 7B

PARTIALLY DEPLETED (PD) SEMICONDUCTOR-ON-INSULATOR (SOI) FIELD EFFECT TRANSISTOR (FET) STRUCTURE WITH A GATE-TO-BODY TUNNEL CURRENT REGION FOR THRESHOLD VOLTAGE (VT) LOWERING AND METHOD OF FORMING THE STRUCTURE

CROSS-REFERENCE TO RELATED APPLICATIONS

This application is a divisional of U.S. Pat. No. 8,698,245, issued on Apr. 15, 2014, the complete disclosure of which is incorporated herein by reference.

BACKGROUND

1. Field of the Invention

The present invention relates to partially depleted (PD) semiconductor-on-insulator (SOI) field effect transistors (FETs) and, more specifically, to embodiments of a PDSOIFET structure with a gate-to-body tunnel current region for threshold voltage (Vt) lowering and a method of forming the PDSOI FET structure.

2. Description of the Related Art

A semiconductor-on-insulator (SOI) field effect transistor (FET) is a FET formed in the semiconductor layer of a semiconductor-on-insulator (SOI) wafer. Shallow trench isolations (STI) structures extend through the semiconductor layer and isolate the SOI FET from other devices within the semiconductor layer. As with any FET, an SOIFET comprises a channel region positioned between source/drain regions and a gate structure positioned above the channel region. However, depending upon the configuration of the source/drain regions as well as the thickness of the semiconductor layer, the channel region of the SOIFET may be fully depleted (FD) or partially depleted (PD). Specifically, in a FDSOIFET, the depletion layer of the channel region between the source/drain regions encompasses the full thickness of the semiconductor layer. In a PDSOIFET, the depletion layer between the source/drain regions is only located in an upper portion of the semiconductor layer near the top surface.

In a PDSOIFET, the non-depleted portion of the channel region that is between the source/drain regions and below the depletion layer is typically referred to as the body of the FET. If this body is not contacted, it is referred to as a floating body. Since the floating body is not contacted (i.e., not biased), its voltage may vary (e.g., as result of leakage currents to Vdd or ground). Variations in the voltage of the floating body will lead to variations in the threshold voltage (Vt) of the PDSOIFET. Furthermore, such threshold voltage variations can differ between PDSOIFETs at different locations within an electronic circuit and can, thereby degrade the performance of the electronic circuit. Performance degradation is particularly notable when some FETs within the electronic circuit require lower threshold voltages than others. For example, in a static random access memory (SRAM) cell within an SRAM array, the pull-down FETs require a lower threshold voltage than the pull-up and pass-gate FETs. Therefore, there is a need in the art for a floating body PDSOIFET structure that provides for threshold voltage (Vt) lowering to, for example, ensure that a FET requiring a lower threshold voltage than other FETs in the same electronic circuit will have a lower threshold voltage.

SUMMARY

In view of the foregoing, disclosed herein are embodiments of a floating body partially depleted semiconductor-on-insulator field effect transistor (PDSOIFET) structure having a gate-to-body tunnel current region that provides for threshold voltage (Vt) lowering without increasing gate current or other leakage currents. In one embodiment, a semiconductor layer has a center portion with a first conductivity type. A gate structure traverses the center portion. This gate structure has adjacent sections with different conductivity types in order to create, within the center portion of the semiconductor layer, a channel region below one section and a gate-to-body tunnel current region below another section. In another embodiment, a semiconductor layer has a center portion with a channel region and a gate-to-body tunnel current region adjacent to the channel region. The channel region is doped with a dopant having a first conductivity type. The gate-to-body tunnel current region comprises: a first implant region immediately adjacent to the channel region and doped with a higher concentration of the same dopant; a second implant region adjacent to the first implant region and having a second conductivity type; and an enhanced generation and recombination region between the first and second implant regions. A gate structure with the second conductivity type traverses the center portion. The PDSOIFET structure embodiments can, for example, be incorporated into any electronic circuit with some FETs requiring a lower threshold voltage than others (e.g., in an Static Random Access Memory (SRAM) array, where pull-down FETs require a lower threshold voltage that pass-gate or pull-up FETs). Also disclosed herein are embodiments of methods of forming these structures More particularly, one embodiment of a field effect transistor, according to the present invention, can comprise a semiconductor layer having end portions and a center portion between the end portions. The center portion can comprise a channel region and a gate-to-body tunnel current region positioned laterally adjacent to the channel region. The channel region and gate-to-body tunnel current region can each have a first conductivity type. A gate structure can traverse the center portion of the semiconductor layer and, specifically, both the channel region and the gate-to-body tunnel current region. This gate structure can comprise a gate dielectric layer on the top surface of the semiconductor layer and a gate conductor layer on the gate dielectric layer. The gate conductor layer can specifically comprise a first conductive section and a second conductive section positioned laterally adjacent to and different from the first conductive section. Specifically, the first conductive section can be positioned on the gate dielectric layer aligned above the gate-to-body tunnel current region and can have the first conductivity type. The second conductive section can be positioned on the gate dielectric layer aligned above the channel region and can have a second conductivity type different from the first conductivity type.

An embodiment of a method of forming this field effect transistor structure can comprise providing a semiconductor layer having end portions and a center portion between the end portions. A gate structure can be formed such that it traverses the center portion. Specifically, a gate dielectric layer can be formed on the top surface of the semiconductor layer. Then, a gate conductor layer can be formed on the gate dielectric layer such that the gate conductor layer comprises: a first conductive section and a second conductive section positioned laterally adjacent to the first conductive section. The first conductive section can be formed such that it has a first conductivity type and such that it is aligned above a first conductivity type gate-to-body tunnel current region within the center portion of the semiconductor layer. The second conductive section can be formed such that it has a second conductivity type different from the first conductivity type and such that it is aligned above a first conductivity type channel region within the center portion of the semiconductor layer. Once the gate structure is formed, additional conventional processing can be performed to complete the field effect transistor structure.

Another embodiment of a field effect transistor structure, according to the present invention, can comprise a semiconductor layer having end portions and a center portion between the end portions. The center portion can further have an area that extends laterally beyond the end portions and can comprise a channel region and a gate-to-body tunnel current region positioned laterally adjacent to the channel region. Specifically, the channel region can be positioned between the end portions and can be doped with a first conductivity type dopant such that it has a first conductivity type. The gate-to-body tunnel current region can be adjacent to the channel region in the area of the center portion that extends laterally beyond the end portions. This gate-to-body tunnel current region can comprise a first implant region that is immediately adjacent to the channel region and doped with the first conductivity type dopant at a higher concentration than the channel region. The gate-to-body tunnel current region can further comprise a second implant region adjacent to the first implant region and doped with a second conductivity type dopant different from the first conductivity type dopant such that the second implant region has a second conductivity type. Finally, the gate-to-body tunnel current region can comprise an enhanced generation and recombination region at the junction between the first implant region and the second implant region. A gate structure can traverse the center portion and, specifically, can traverse both the gate-to-body tunnel current region and the channel region.

An embodiment of a method of forming this field effect transistor structure can comprise providing a semiconductor layer doped with a first conductivity type dopant such that the semiconductor layer has the first conductivity type. This semiconductor layer can further have end portions and a center portion between the end portions, the center portion can have an area that extends laterally beyond the end portions. Next, a gate-to-body tunnel current region can be formed in the area of the center portion that extends laterally beyond the end portions. Specifically, a first implant region can be formed within this area and immediately adjacent to a designated channel region that is in the center portion between the end portions. This first implant region can be formed such that it is doped with the first conductivity type dopant at a higher concentration than the channel region. Additionally, a second implant region can be formed adjacent to the first implant region. This second implant region can be formed such that it is doped with a second conductivity type dopant different from the first conductivity type dopant such that the second implant region has a second conductivity type different from the first conductivity type. Finally, an enhanced generation and recombination region can be formed at the junction between the first implant region and the second implant region. Once the gate-to-body tunnel current region is formed, a gate structure can be formed such that it traverses the center portion, including the gate-to-body tunnel current region and channel region, and additional conventional processing can be performed to complete the field effect transistor structure.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which:

FIG. 6 is a cross-section diagram illustrating a partially completed structure formed according to the method of FIG. 5;

FIG. 7A is a cross-section diagram illustrating a partially completed structure formed according to the method of FIG. 5;

FIG. 7B is a cross-section diagram illustrating a partially completed structure formed according to the method of FIG. 5;

DETAILED DESCRIPTION

Figure 1:
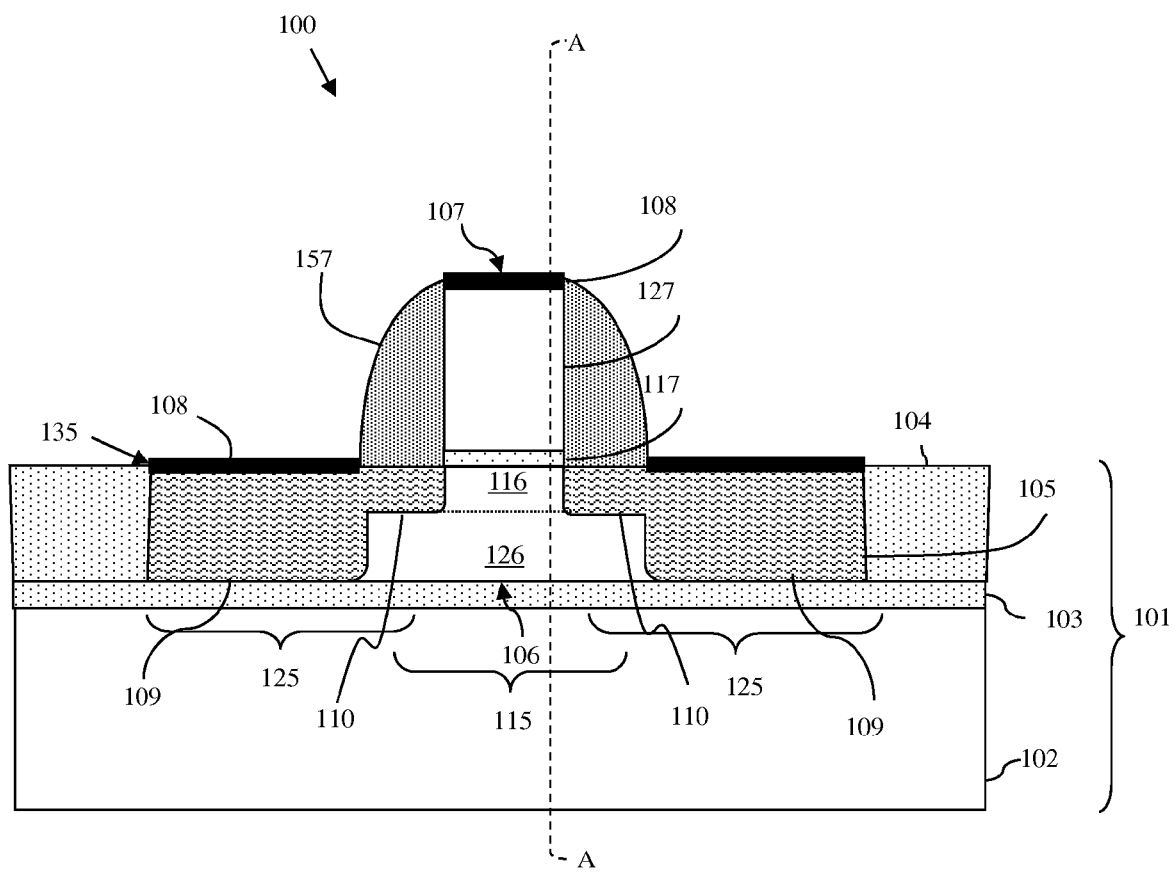
FIG. 1 is a cross-section illustration of an embodiment of a floating body partially depleted semiconductor-on-insulator field effect transistor (PDSOIFET) structure.

The embodiments of the invention and the various features and advantageous details thereof are explained more fully with reference to the non-limiting embodiments that are illustrated in the accompanying drawings and detailed in the following description.

As mentioned above, a semiconductor-on-insulator (SOI) field effect transistor (FET) is a FET formed in the semiconductor layer of a semiconductor-on-insulator (SOI) wafer.

Shallow trench isolations (STI) structures extend through the semiconductor layer and isolate the SOI FET from other devices within the semiconductor layer. As with any FET, an SOIFET comprises a channel region positioned between source/drain regions and a gate structure positioned above the channel region. However, depending upon the configuration of the source/drain regions as well as the thickness of the semiconductor layer, the channel region of the SOIFET may be fully depleted (FD) or partially depleted (PD). Specifically, in a FDSOIFET, the depletion layer of the channel region between the source/drain regions encompasses the full thickness of the semiconductor layer. In a PDSOIFET, the depletion layer between the source/drain regions is only located in an upper portion of the semiconductor layer near the top surface.

In a PDSOIFET, the non-depleted portion of the channel region that is between the source/drain regions and below the depletion layer is typically referred to as the body of the FET. If this body is not contacted, it is referred to as a floating body. Since the floating body is not contacted (i.e., not biased), its voltage may vary (e.g., as result of leakage currents to Vdd or ground). Variations in the voltage at the floating body will lead to variations in the threshold voltage (Vt) of the PDSOIFET. Furthermore, such threshold voltage variations can differ between PDSOIFETs at different locations within an electronic circuit and can, thereby degrade the performance of the electronic circuit. Performance degradation is particularly notable when some FETs within the electronic circuit require lower threshold voltages than others. For example, in a static random access memory (SRAM) cell within an SRAM array, the pull-down FETs require a lower threshold voltage than the pull-up and pass-gate FETs. Therefore, there is a need in the art for a floating body PDSOIFET structure that provides for threshold voltage (Vt) lowering to, for example, ensure that a FET requiring a lower threshold voltage than other FETs in the same electronic circuit will have a lower threshold voltage.

In view of the foregoing, disclosed herein are embodiments of a floating body partially depleted semiconductor-on-insulator field effect transistor (PDSOIFET) structure having a gate-to-body tunnel current region that provides for threshold voltage (Vt) lowering without increasing gate current or other leakage currents. In one embodiment, a semiconductor layer has a center portion with a first conductivity type. A gate structure traverses the center portion. This gate structure has adjacent sections with different conductivity types in order to create, within the center portion of the semiconductor layer, a channel region below one section and a gate-to-body tunnel current region below another section. In another embodiment, a semiconductor layer has a center portion with a channel region and a gate-to-body tunnel current region adjacent to the channel region. The channel region is doped with a dopant having a first conductivity type. The gate-to-body tunnel current region comprises: a first implant region immediately adjacent to the channel region and doped with a higher concentration of the same dopant; a second implant region adjacent to the first implant region and having a second conductivity type; and an enhanced generation and recombination region between the first and second implant regions. A gate structure with the second conductivity type traverses the center portion. The PDSOIFET structure embodiments can, for example, be incorporated into any electronic circuit with some FETs requiring a lower threshold voltage than others (e.g., in an Static Random Access Memory (SRAM) array, where pull-down FETs require a lower threshold voltage that pass-gate or pull-up FETs). Also disclosed herein are embodiments of methods of forming these structures It should be noted that in the structure and method embodiments described below the "first conductivity type" and "second conductivity type" will vary depending upon whether described field effect transistor is a n-type field effect transistor (NFET) or p-type field effect transistor (PFET). Specifically, for an NFET, the first conductivity type refers to P-type conductivity and the second conductivity type refers to N-type conductivity. However, for a PFET the reverse is true. That is, for a PFET, the first conductivity type refers to N-type conductivity and the second conductivity type refers to P-type conductivity. It should further be noted that in the structure and method embodiments described below, a P-type dopant can comprise, for example, a Group III dopant, such as boron (B) or indium (In), and an N-type dopant can comprise, for example, a Group V dopant, such as arsenic (As), phosphorous (P) or antimony (Sb)).

Figure 2:
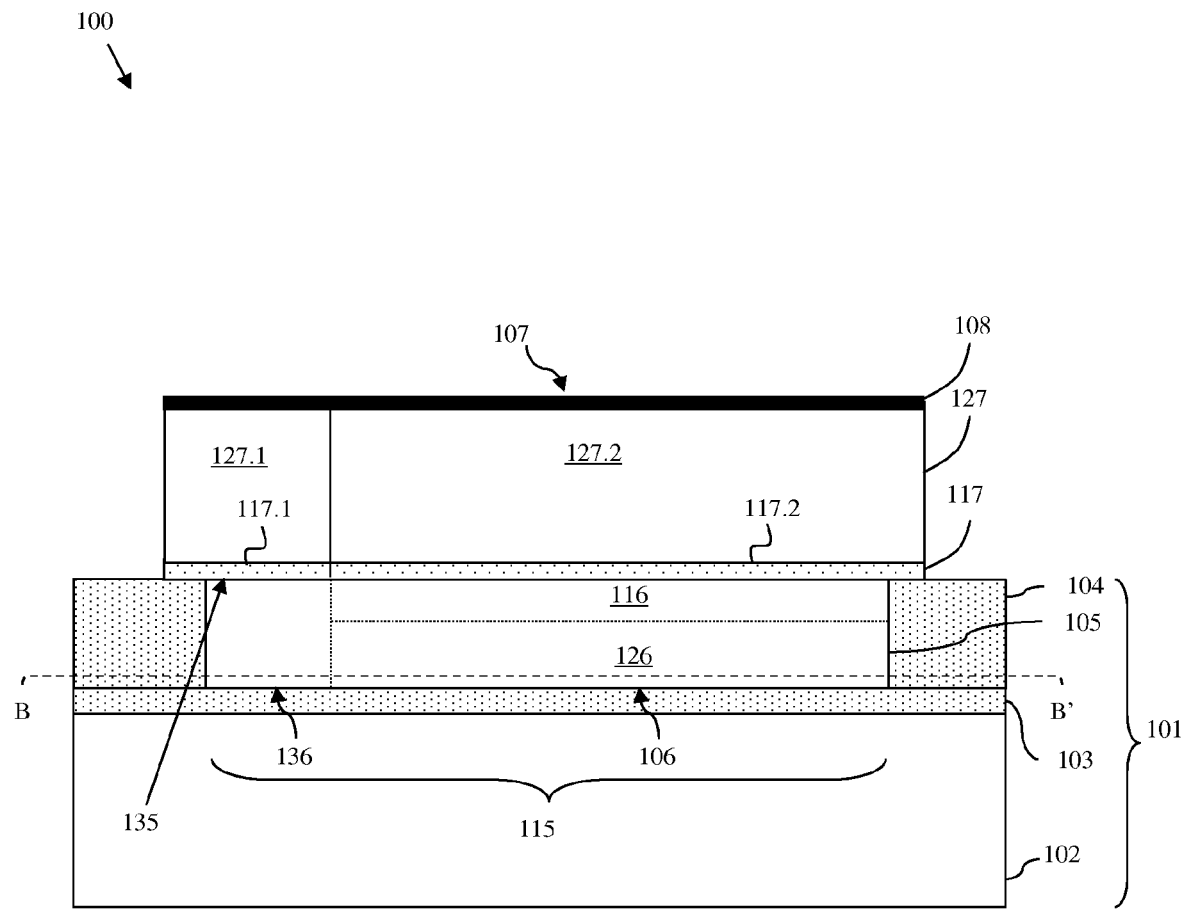
FIG. 2 is a different cross-section illustration of the same PDSOIFET structure of FIG. 1.
Figure 3:
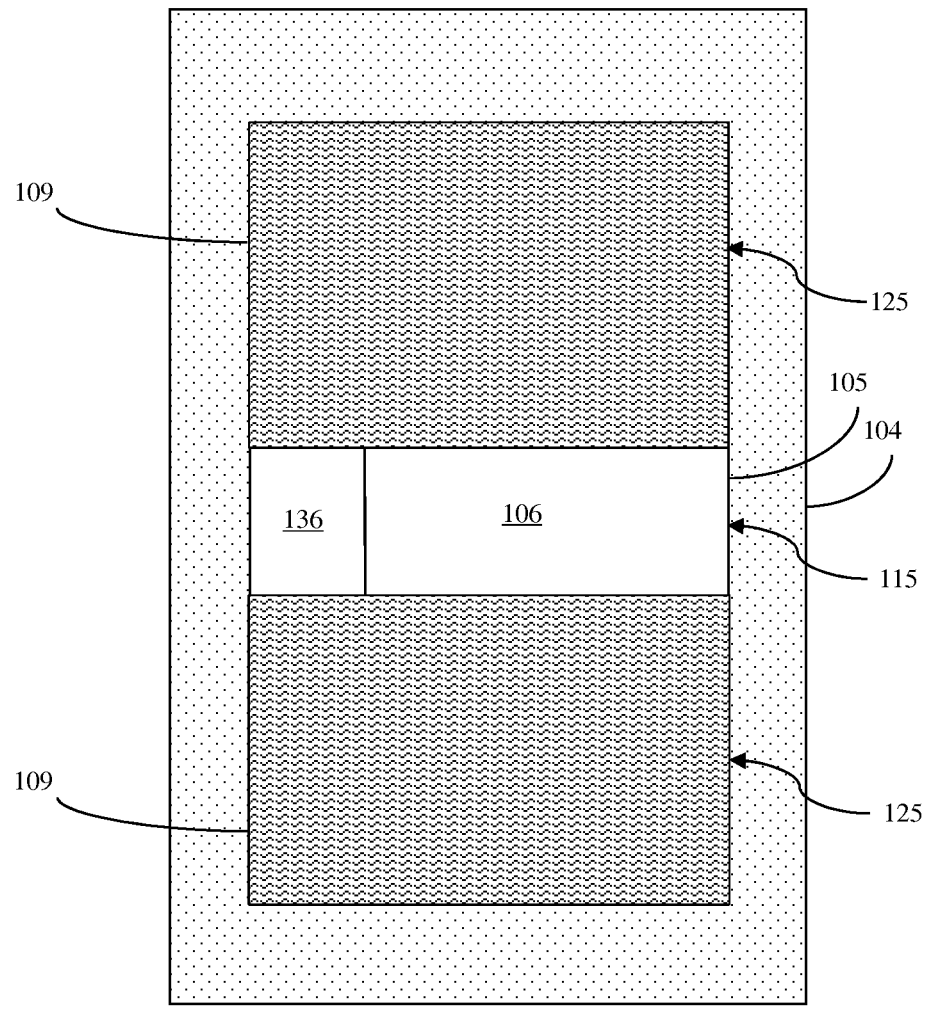
FIG. 3 is a different cross-section illustration of the same PDSOIFET structure of FIG. 1.
Figure 4:
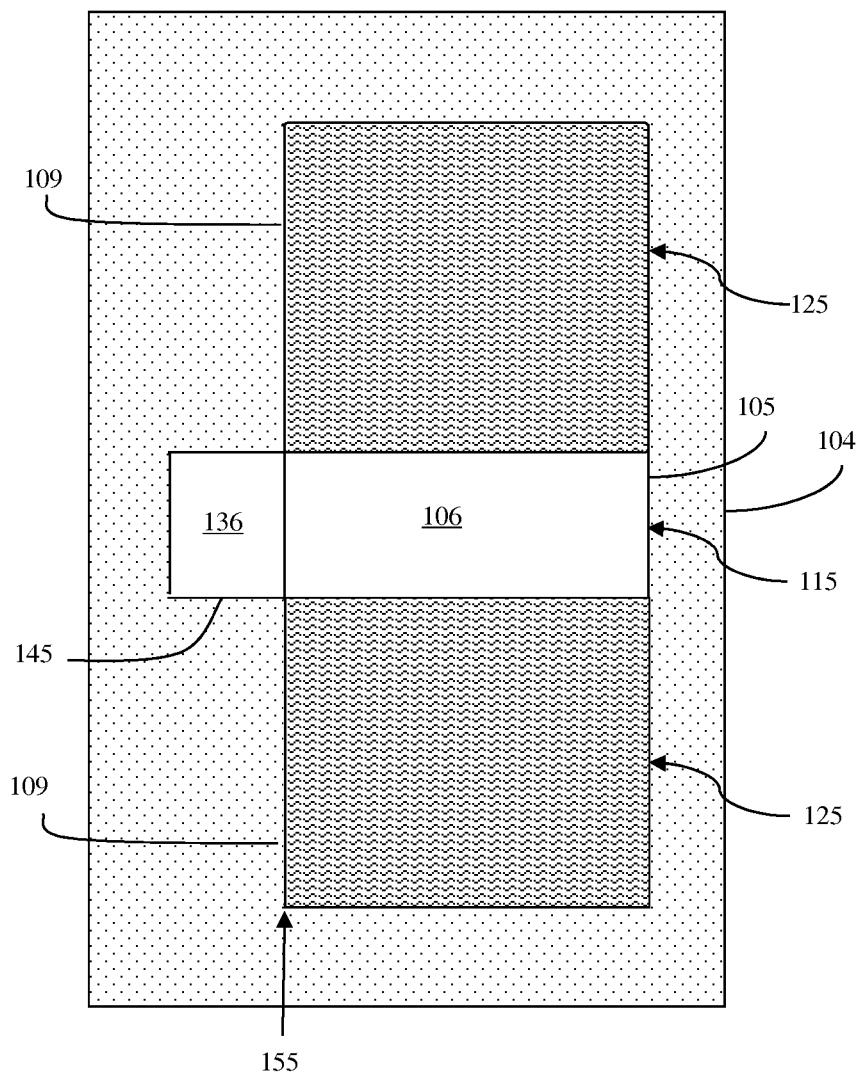
FIG. 4 is a different cross-section illustration of the same PDSOIFET structure of FIG. 1.

FIGS. 1-4 illustrate an embodiment of a floating body partially depleted semiconductor-on-insulator field effect transistor (PDSOIFET) structure 100 according to the present invention. Specifically, FIG. 1 is a cross-section illustration of the PDSOIFET 100 through a vertical plane that cuts across the middle of the device along its length. FIG. 2 is a cross-section illustration of the same PDSOIFET 100 through a vertical plane that cuts across the middle of the device along its width (i.e., through vertical plane A-A' as shown in FIG. 1). FIGS. 3 and 4 are alternative cross-section illustrations of the same PDSOIFET 100 through a horizontal plane that cuts across the active region of the device (i.e., through horizontal plane B-B' as shown in FIG. 2).

Referring to FIG. 1, this field effect transistor 100 can be formed on a semiconductor-on-insulator (SOI) wafer 101 comprising a semiconductor substrate 102 (e.g., a silicon substrate or other semiconductor substrate). The SOI wafer 101 can further comprise an insulator layer 103 (e.g., a silicon oxide layer or other suitable insulator layer) on the substrate 102 and a semiconductor layer 105 (e.g., a single crystalline silicon layer or other suitable semiconductor layer) on the insulator layer 103.

A trench isolation structure 104 can extend vertically through the semiconductor layer 105 to the insulator layer 103, can define the shape of the semiconductor layer 105 (i.e., can define the shape of the active region of the field effect transistor 100) and can electrically isolate the field effect transistor 100 from other devices on the wafer 101. The trench isolation structure 104 can comprise, for example, conventional shallow trench isolation (STI) structure comprising a trench filled with one or more isolation materials (e.g., a silicon oxide, silicon nitride, silicon oxynitride, etc.). The shape of the semiconductor layer 105, as defined by the trench isolation structure 104, may vary depending upon the FET configuration (see FIGS. 3 and 4 and the detail discussion below). As defined by the trench isolation structure 104, the semiconductor layer 105 can have end portions 125 and a center portion 115 between the end portions 125.

Referring again to FIG. 1, this semiconductor layer 105 can comprise a channel region 106 in the center portion 115 and source/drain regions 109 in the end portions 125. The channel region 106 can be doped with a first conductivity type dopant such that it has a first conductivity type. The source/drain regions 109 can be doped with a second conductivity type dopant such that they have a second conductivity type different from the first conductivity type.

Additionally, a gate structure 107 can be positioned above the channel region 106. As discussed in greater detail below, the gate structure 107 can comprise a gate dielectric layer 117 and a gate conductor layer 127 above the gate dielectric layer. The channel region 106 can be partially depleted (e.g., as a result of the thickness of the semiconductor layer 105) with a depletion layer 116 in the upper portion (i.e., at the top surface 135 of the semiconductor layer 105 immediately adjacent to the gate dielectric layer 117) and a body 126 below the depletion layer 116.

Referring to FIG. 2 in combination with FIG. 1, the semiconductor layer 105 can further comprise, within the center portion 115, a gate-to-body tunnel current region 136 positioned laterally immediately adjacent to (i.e., abutting) the channel region 106. This gate-to-body tunnel current region 136 can have the same first conductivity type as the channel region 106. For example, the gate-to-body tunnel current region 136 and channel region 106 can both be doped with a same relatively low concentration of the first conductivity type dopant. In this case, the semiconductor layer 105, as defined by the trench isolation structure 104, can have a rectangular shape and the gate-to-body tunnel current region 136, like the channel region 106, can be positioned between the source/drain regions 109 in the end portions 125 of the semiconductor layer 105 (see FIG. 3). Alternatively, the gate-to-body tunnel current region 136 and channel region 106 can both be doped with the first conductivity type dopant, but the gate-to-body tunnel current region 136 can be doped with a higher concentration of that dopant. In this case, it is necessary to separate the highly doped first conductivity type gate-to-body tunnel current region 136 from the second conductivity type source/drain regions 109. Thus, the semiconductor layer 105, as defined by the trench isolation structure 104, requires a unique shape. Specifically, the semiconductor layer 105 can have an essentially rectangular shape with an additional area 145 (e.g., a tab, an extension, etc.) of the center portion 115 extending laterally beyond the end portions 109 (i.e., extending laterally beyond the sidewall 155) (see FIG. 4). The gate-to-body tunnel current region 136, having a higher dopant concentration than the channel region 106, can be contained within this area 145 such that it is immediately adjacent to the channel region 106 on one side and surrounded by the trench isolation structure 104 on the remaining three sides (i.e., such that it is not positioned between the source/drain regions 109)

Referring again to FIG. 2 in combination with FIG. 1, the gate structure 107 can traverse the center portion 115 of the semiconductor layer 105. This gate structure 107 can comprise a gate dielectric layer 117 on the top surface 135 of the semiconductor layer 105. It can further comprise a gate conductor layer 127 on the gate dielectric layer 117.

The gate conductor layer 127 can specifically comprise a first conductive section 127.1 and a second conductive section 127.2 positioned laterally adjacent to and different from the first conductive section 127.1. The first conductive section 127.1 can be positioned on the gate dielectric layer 117 above the gate-to-body tunnel current region 136 and can have the first conductivity type. The second conductive section 127.2 can be positioned on the gate dielectric layer 117 above the channel region 106 and can have the second conductivity type.

For example, the gate conductor layer 127 can comprise a polysilicon gate conductor layer. In this case, the first conductive section 127.1 above the gate-to-body tunnel current region 136 can be doped with a first conductivity type dopant and the second conductive section 127.2 above the channel region 106 can be doped with a second conductivity type dopant. For example, for an NFET, the first conductive section 127.1 can be doped with a P-type dopant and the second conductive section 127.2 can be doped with an N-type dopant. For a PFET, the first conductive section 127.1 can be doped with an N-type dopant and the second conductive section 127.2 can be doped with be doped with a P-type dopant.

Alternatively, the gate conductor layer 127 can comprise discrete metal sections with different work functions (e.g., one section being near the valence band of silicon and another section being near the conduction band of silicon, as appropriate depending upon whether the device is an NFET or a PFET). Alternatively, the gate conductor layer 127 can comprise a combination of metal and polysilicon sections with different work functions (e.g., one section being near the valence band of silicon and another section being near the conduction band of silicon, as appropriate depending upon whether the device is an NFET or a PFET).

The gate dielectric layer 117 can be essentially uniform across both the gate-to-body tunnel current region 136 and above the channel region 106. That is, it can comprise the same material and can have essentially the same thickness above both regions 136 and 106. For example, the gate dielectric layer 117 can comprise a uniform layer of silicon dioxide ($SiO_2$) or a uniform layer of any other suitable gate dielectric material. Alternatively, the gate dielectric layer 117 can comprise a first dielectric section 117.1 between the first conductive section 127.1 and the gate-to-body tunnel current region 136 and a second dielectric section 117.2, different from the first dielectric section 117.1, between the second conductive section 127.2 and the channel region 106. In this case, the first and second dielectric sections 117.1-117.2 can comprise different dielectric materials with different dielectric constants and/or can have different thicknesses so that the first dielectric section 117.1 is "leakier" than the second dielectric section 117.2. For example, the first dielectric section 117.1 can comprise a dielectric material with a lower dielectric constant than the dielectric material used for the second dielectric section 117.2 and/or the first dielectric section 117.1 can be thinner than the second dielectric section 117.2.

Finally, the first and second conductive sections 127.1 and 127.2 of the gate conductor layer 127 can be electrically connected by a metal silicide layer 108 positioned on the top surface of the gate conductor layer 127 and extending laterally over and immediately adjacent to both the first and second conductive sections 127.1-127.2. This metal silicide layer 108 can, for example, comprise a silicide of a refractory or noble metal (e.g., nickel, cobalt, tungsten, chromium, platinum, titanium, molybdenum, palladium, etc.) or an alloy thereof.

In operation, the first conductive section 127.1 inhibits channel inversion in the gate-to-body tunnel current region 136 below, allowing current to flow through the gate-to-body tunnel current region 136 and into the body 126 of the PDSOIFET 100 to reduce the threshold voltage. In the case of an NFET, this gate-to-body tunnel current region 136 essentially functions as a hole-tunnel region. In the case of a PFET, this gate-to-body tunnel current region 136 essentially functions as an electron-tunnel region. Consequently, a PDSOIFET 100, as described above, is ideal for incorporation into a circuit, such as an static random access memory (SRAM) array, in which some FETs (e.g., pull-down FETs of an SRAM cell) benefit from a lower threshold voltage when the gate is on, than others (e.g., pass-gate and pull-up FETs of an SRAM cell).

It should be noted that the PDSOIFET 100, as described above and illustrated in FIGS. 1-4, may comprise any number of additional features that are not described above. These features can include, but are not limited to, source/drain extension regions 110, halo regions, stress layers, gate sidewall spacers 157, etc. Such FET features are well-known in the art and are, thus, omitted from this specification in order to allow the reader to focus on the salient aspects of the invention.

Figure 5:
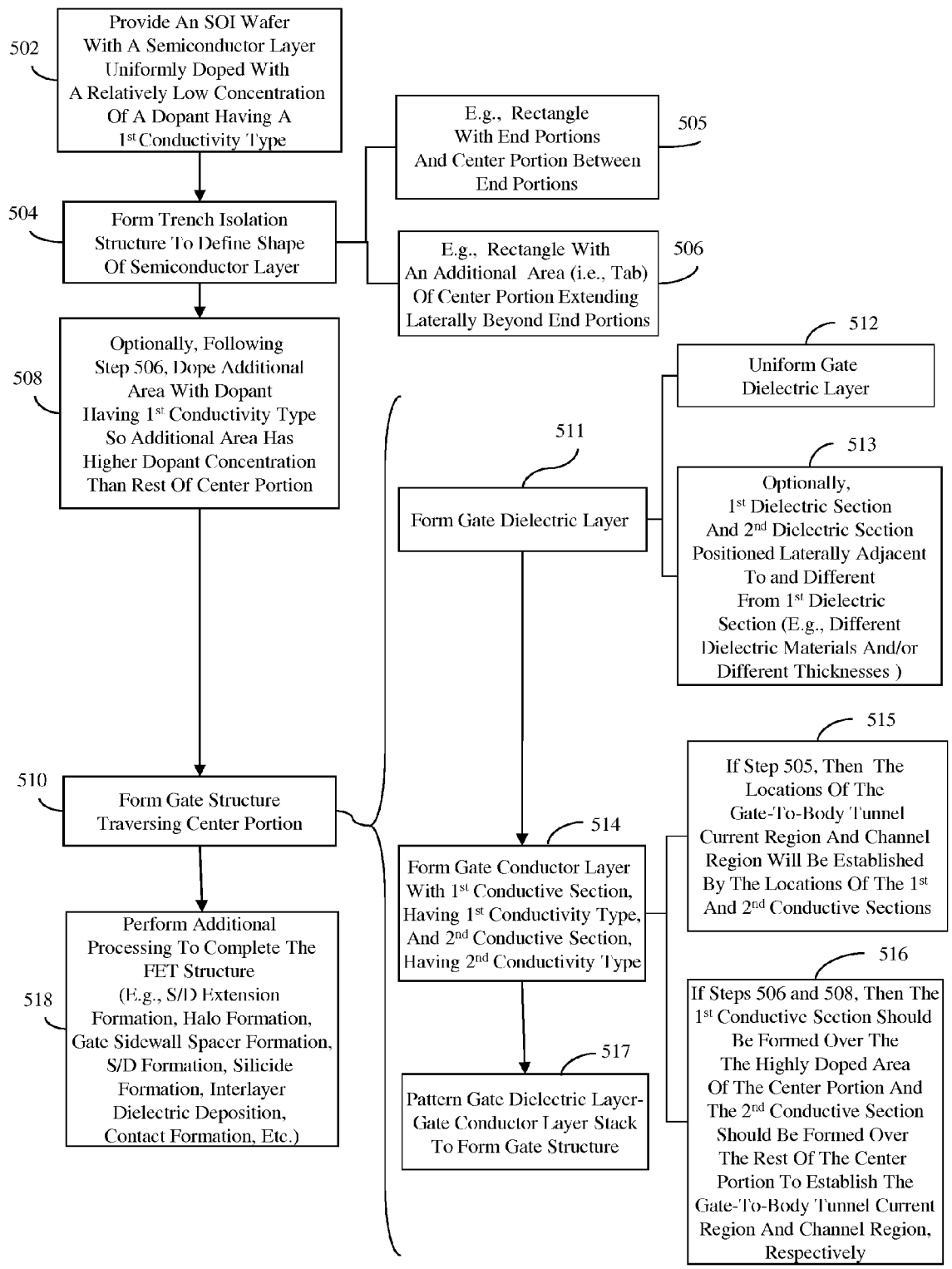
FIG. 5 is a flow diagram illustrating an embodiment of a method of forming the PDSOIFET structure of FIGS. 1-4.

Referring to FIG. 5, an embodiment of a method of forming the above-described PDSOIFET structure 100 can comprise providing a semiconductor-on-insulator (SOI) wafer 101 comprising a semiconductor substrate 102 (e.g., a silicon substrate or other semiconductor substrate) (502, see FIG. 6). The SOI wafer 101 can further comprise an insulator layer 103 (e.g., a silicon oxide layer or other suitable insulator layer) on the substrate 102 and a semiconductor layer 105 on the insulator layer 103. This semiconductor layer 105 can comprise a single crystalline silicon layer or other suitable semiconductor layer essentially uniformly doped with a relatively low concentration of a first conductivity type dopant such that initially the semiconductor layer 106 has a first conductivity type.

A trench isolation structure 104 can be formed that extends vertically through the semiconductor layer 105 to the insulator layer 103 in order to define the shape of the semiconductor layer 105 (i.e., to define the shape of the active region of the field effect transistor 100) and to electrically isolate the field effect transistor 100 from other devices on the wafer 101 (504). The trench isolation structure 104 can be formed, for example, using conventional shallow trench isolation (STI) formation techniques. That is, a trench can be formed (e.g., using lithographic patterning techniques) and, then, filled with one or more isolation materials (e.g., a silicon oxide, silicon nitride, silicon oxynitride, etc.). The shape of the semiconductor layer 105, as defined by the trench isolation structure 104, may vary. For example, following trench isolation structure 104 formation, the semiconductor layer 105 can have a rectangular shape with end portions 125 and a center portion 115 between the end portions 125 (505, see FIG. 7A). Alternatively, following trench isolation structure 104 formation, the semiconductor layer 105 can have an essentially rectangular shape with an additional area 145 (e.g., a tab, extension, etc.) of the center portion 115 extending laterally beyond the end portions 125 (i.e., extending laterally beyond the sidewall 155) (506, see FIG. 7B). The selected shape will depend upon the desired dopant concentration for the gate-to-body tunnel current region (as discussed in greater detail below).

Figure 8:
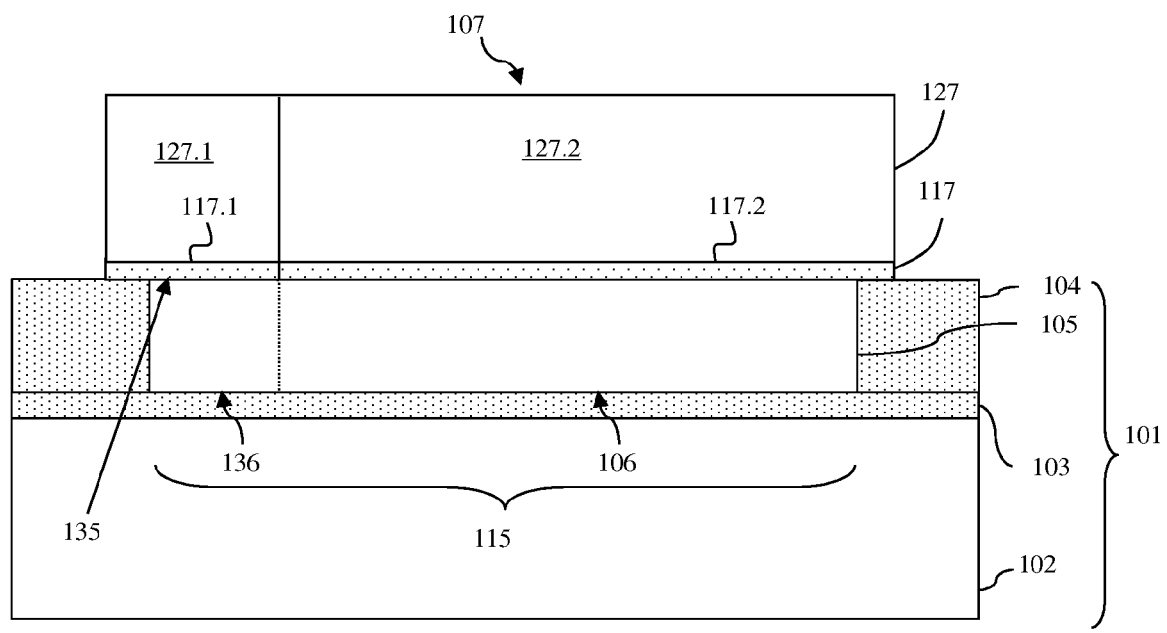
FIG. 8 is a cross-section diagram illustrating a partially completed structure formed according to the method of FIG. 5.

A gate structure 107 can be formed such that it traverses the center portion 115 of the semiconductor layer 105 (510, see FIG. 8). For example, a gate dielectric layer 117 can be formed on the top surface of the semiconductor layer 105 (511). Then, a gate conductor layer 127 can be formed on the gate dielectric layer 117 (514). Finally, the gate dielectric layer-gate conductor layer stack can be patterned, e.g., using conventional lithographic patterning techniques, in order to form the gate structure 107 that traverses the center portion 115 of the semiconductor layer 105 (517).

Specifically, at process 511, the gate dielectric layer 117 can be formed (e.g., deposited) such that it is essentially uniform (i.e., such that it has the same thickness and comprises the same material) across the entire center portion 115 (512). For example, a uniform layer of silicon dioxide (SiO₂) or any other suitable gate dielectric material can be deposited onto the top surface 135 of the semiconductor layer 105. Alternatively, the gate dielectric layer 117 can be formed (e.g., using multiple masked deposition processes) such that it comprises a first dielectric section 117.1 over a designated gate-to-body tunnel current region 136 within the center portion 115 of the semiconductor layer 105 and a second dielectric section 117.2, different from the first dielectric section 117.1, over a designated channel region 106 within the center portion 115 of the semiconductor layer 105 (513). In this case, the first and second dielectric sections 117.1-117.2 can be formed such that they comprise different dielectric materials with different dielectric constants and/or such that they have different thicknesses so that the first dielectric section 117.1 is "leakier" than the second dielectric section 117.2. For example, the first dielectric section 117.1 can be formed with a dielectric material that has with a lower dielectric constant than the dielectric material used to form the second dielectric section 117.2 and/or the first dielectric section 117.1 can be formed such that it is thinner than the second dielectric section 117.2.

Additionally, at process 514, the gate conductor layer 127 can be formed on the gate dielectric layer 117 such that it comprises: a first conductive section 127.1 and a second conductive section 127.2 positioned laterally adjacent to the first conductive section 127.1. Specifically, the first conductive section 127.1 can be formed such that it has the first conductivity type and such that it is aligned above the designated gate-to-body tunnel current region 136 of the center portion 115 of the semiconductor layer 105. The second conductive section 127.2 can be formed such that it has the second conductivity type different from the first conductivity type and such that it is aligned above the designated channel region 106 of the center portion 115 of the semiconductor layer 105.

For example, a polysilicon layer can be deposited onto the gate dielectric layer 117. Then, multiple masked implantation processes can be performed in order to form the first and second sections 127.1-127.2. For example, the section 127.2 of the polysilicon layer aligned above the designated channel region 106 can be masked and a dopant implant process can be performed in order to dope the exposed section 127.1 of the polysilicon layer with a first conductivity type dopant so that it has the first conductivity type. The mask above the section 127.1 of the polysilicon layer can be removed and another mask can be formed above the section 127.2. Then, another dopant implant process can be performed in order to dope the exposed section 127.2 with a second conductivity type dopant so that it has the second conductivity type. For example, for an NFET, the first conductive section 127.1 can be doped with a P-type dopant and the second conductive section 127.2 can be doped with an N-type dopant. For a PFET, the first conductive section 127.1 can be doped with an N-type dopant and the second conductive section 127.2 can be doped with be doped with a P-type dopant.

Alternatively, the gate conductor layer 127 can be formed such that it comprises discrete metal sections with different work functions (e.g., one section being near the valence band of silicon and another section being near the conduction band of silicon, as appropriate depending upon whether the device is an NFET or a PFET). Alternatively, the gate conductor layer 127 can be formed such that it comprises a combination of metal and polysilicon sections with different work functions (e.g., one section being near the valence band of silicon and another section being near the conduction band of silicon, as appropriate depending upon whether the device is an NFET or a PFET).

After the gate structure is formed at process 510, various additional processes can be performed in order to complete the FET structure (518, see FIG. 1). These additional processes can include, but are not limited to, forming second conductivity type source/drain extension regions 110 adjacent to the channel region 106, forming first conductivity type halo regions between the source/drain extension regions and the channel region 106, forming gate sidewall spacers 157, forming second conductivity type source/drain regions 109 within the end portions 125 of the semiconductor layer 105, forming a metal silicide layer 108 on the gate conductor layer 127 and source/drain regions 109, depositing an interlayer dielectric material, forming contacts, etc.

In addition to the process steps described above, various alternative process steps can be performed prior to gate structure formation in order to ensure that the gate-to-body tunnel current region 136 has the desired conductivity relative to the channel region 106. For example, process steps can be performed to ensure that the gate-to-body tunnel current region and channel region have the same conductivity type (i.e., the first conductivity type) and the same dopant concentration level or the same conductivity type and different dopant concentration levels Specifically, prior to gate structure formation at process 510, the semiconductor layer 105 can initially be uniformly doped with a first conductivity type dopant such that it has the first conductivity type. At process 505, the shape of the semiconductor layer 105 can be defined by a trench isolation structure 104 such that it is rectangular (see FIG. 7A). If no additional doping processes are performed on the center portion 115, then the gate-to-body tunnel current region 136 and the channel region 106 will have the same conductivity type and the same dopant concentration. During gate structure formation, it is simply the locations of the first and second conductive sections 127.1 and 127.2 of the gate conductor layer 127 relative to the center portion 115 of the semiconductor layer 105 that establish the locations of the gate-to-body tunnel current region 136 and channel region 106, respectively. That is, once the gate structure is formed, the gate-to-body tunnel current region 136 will necessarily be aligned below the first conductive section 127.1 and the channel region 106 will necessarily be aligned below the second conductive section 127.2.

Figure 9:
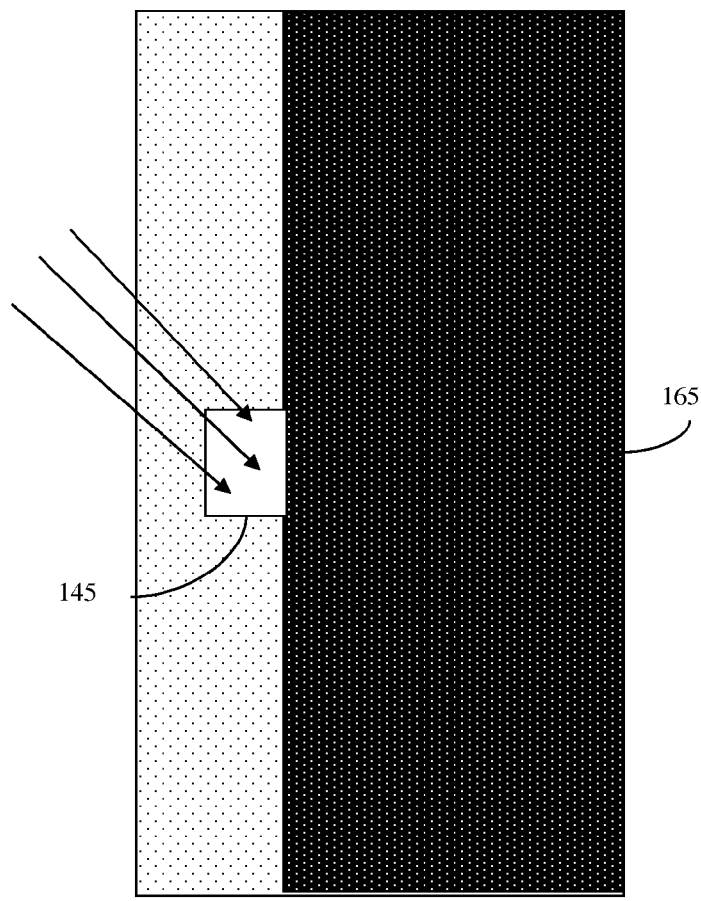
FIG. 9 is a cross-section diagram illustrating a partially completed structure formed according to the method of FIG. 5.

Alternatively, prior to gate structure formation at process 510, the semiconductor layer 105 can initially be uniformly doped with a first conductivity type dopant such that it has the first conductivity type. However, at process 506, the shape of the semiconductor layer 105 can be defined by a trench isolation structure 104 such that it is essentially rectangular shape with an additional area 145 (i.e., a tab or extension) of the center portion 115 extending laterally beyond the end portions 125 (i.e., beyond sidewall 155) (see FIG. 7B). Next, this area 145 (i.e., tab) of the center portion 115 which extends laterally beyond the end portions 125 can again be doped with a first conductivity type dopant (i.e., the same dopant already in the semiconductor layer 105) such that it has a higher dopant concentration than the rest of the center portion 115 (508). For example, a mask 165 can be formed on the semiconductor layer 105 and patterned such that the area 145 is exposed and a dopant implant process can be performed in order to increase the concentration of the first conductivity type dopant in that area 145 (see FIG. 9). During gate structure formation, the first conductive section 127.1 is aligned above this highly doped area 145 (i.e., the gate-to-body tunnel current region 136) and the second conductive section 127.2 is aligned above the rest of the center portion (i.e., the channel region 106). Thus, in the resulting structure 100, the gate-to-body tunnel current region 136 has a same first conductivity type as the channel region 106, has a higher dopant concentration than the channel region 106, and is not positioned between second conductivity type source/drain regions 109 in the end portions 125 of the semiconductor layer 105.

Figure 10:
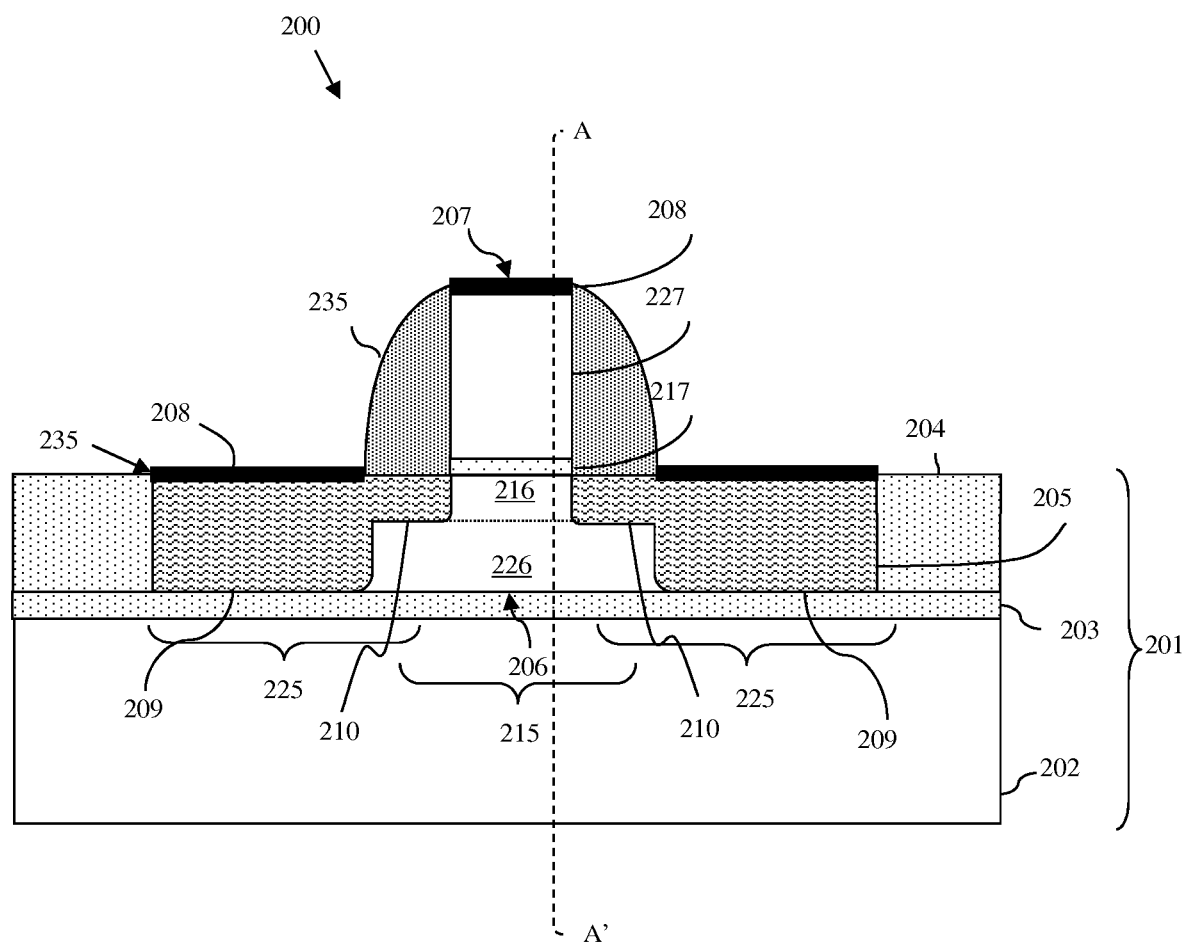
FIG. 10 is a cross-section illustration of another embodiment of a floating body partially depleted semiconductor-on-insulator field effect transistor (PDSOIFET) structure.
Figure 11:
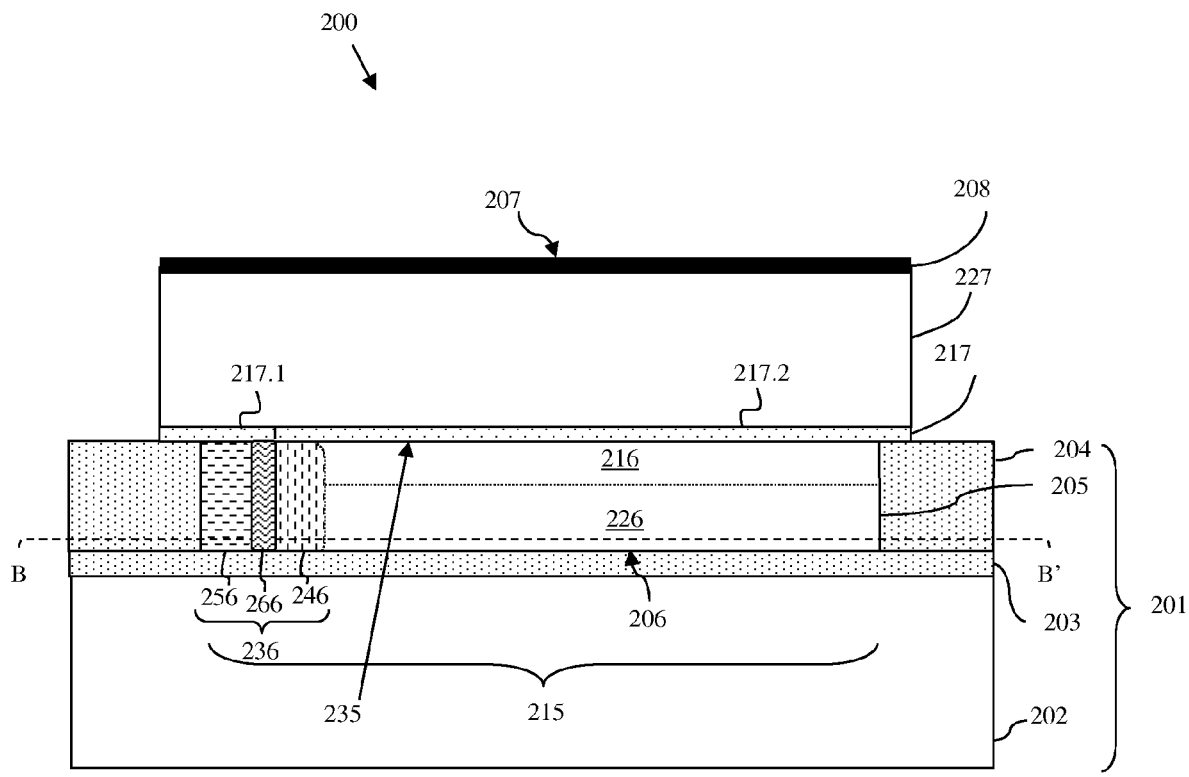
FIG. 11 is a different cross-section illustration of the same PDSOIFET structure of FIG. 10.
Figure 12:
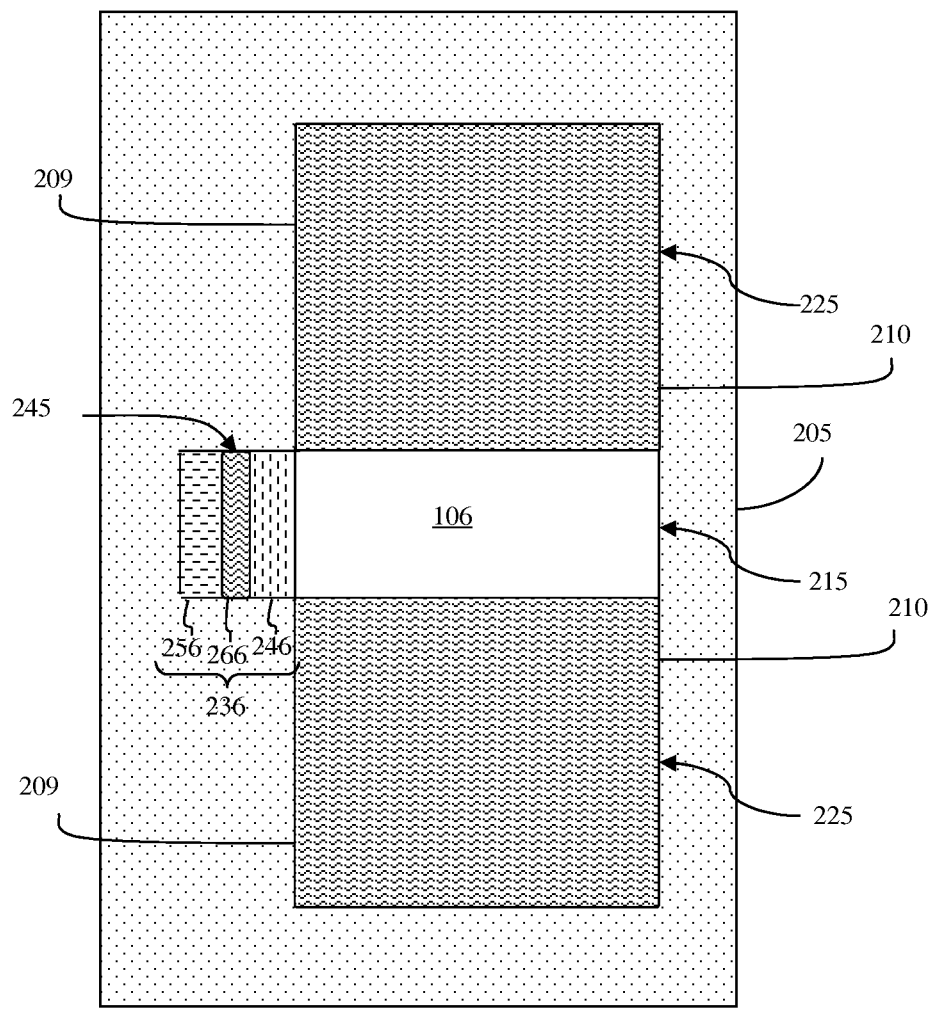
FIG. 12 is a different cross-section illustration of the same PDSOIFET structure of FIG. 10.

FIGS. 10-12 illustrate another embodiment of a floating body partially depleted semiconductor-on-insulator field effect transistor (PDSOIFET) structure 200 according to the present invention. FIG. 10 is a cross-section illustration the PDSOIFET 200 through a vertical plane that cuts across the middle of the device along its length. FIG. 11 is a cross-section illustration of the same PDSOIFET 200 through a vertical plane that cuts across the middle of the device along its width (i.e., through vertical plane A-A' as shown in FIG. 10). FIG. 12 is a cross-section illustration of the same PDSOIFET 200 through a horizontal plane that cuts across the active region of the device (i.e., through horizontal plane B-B' as shown in FIG. 11).

Referring to FIG. 10, this field effect transistor 200 can be formed on a semiconductor-on-insulator (SOI) wafer 201 comprising a semiconductor substrate 202 (e.g., a silicon substrate or other semiconductor substrate). The SOI wafer 201 can further comprise an insulator layer 203 (e.g., a silicon oxide layer or other suitable insulator layer) on the substrate 202 and a semiconductor layer 205 (e.g., a single crystalline silicon layer or other suitable semiconductor layer) on the insulator layer 203.

A trench isolation structure 204 can extend vertically through the semiconductor layer 205 to the insulator layer 203, can define the shape of the semiconductor layer 205 (i.e., can define the shape of the active region of the field effect transistor 200) and can electrically isolate the field effect transistor 200 from other devices on the wafer 201. The trench isolation structure 204 can comprise, for example, conventional shallow trench isolation (STI) structure comprising a trench filled with one or more isolation materials (e.g., a silicon oxide, silicon nitride, silicon oxynitride, etc.). The shape of the semiconductor layer 205, as defined by the trench isolation structure 204, can be essentially rectangular with an additional area 245 (e.g., a tab, extension, etc.) of the center portion 215 extending laterally beyond the end portions 225 (i.e., extending laterally beyond the sidewall 255) (see FIG. 12). As defined by the trench isolation structure 204, the semiconductor layer 205 can have end portions 225 and a center portion 215 between the end portions 225.

Referring to FIGS. 10-12 in combination, the center portion 215 of the semiconductor layer 205 can comprise a channel region 206 and a gate-to-body tunnel current region 236 positioned laterally adjacent to the channel region. Specifically, the channel region 206 can be positioned between the end portions 225 of the semiconductor layer 205 and can be doped with a first conductivity type dopant such that it has a first conductivity type. The channel region 206 can be partially depleted (e.g., as a result of the thickness of the semiconductor layer 205) with a depletion layer 216 in the upper portion (i.e., at the top surface 235 of the semiconductor layer 205) and a body 226 below the depletion layer 216. The gate-to-body tunnel current region 236 can be adjacent to the channel region 206 in the area 245 of the center portion 215 that extends laterally beyond the end portions 225. This gate-to-body tunnel current region 236 can comprise a first implant region 246 that is immediately adjacent to the channel region 206 and doped with the first conductivity type dopant at a higher concentration than the channel region 206. The gate-to-body tunnel current region 236 can further comprise a second implant region 256 adjacent to the first implant region 246 and doped with a second conductivity type dopant different from the first conductivity type dopant such that the second implant region 256 has a second conductivity type. Finally, the gate-to-body tunnel current region 236 can comprise an enhanced generation and recombination region 266 at the junction between the first implant region 246 and the second implant region 256. This enhanced generation and recombination region 266 can comprise a third implant region overlapping the first and second implant region. This third implant region can, for example, be implanted with ions of xenon, germanium, gold, platinum, oxygen, neon, argon, krypton or any other material suitable for damaging the junction between the first and second implant regions 246 and 256 so as to allow charge carriers from those implant regions to recombine readily. Alternatively, the enhanced generation and recombination region 266 can comprise a metal layer (e.g., a metal-filled opening) extending vertically between and in direct contact with both the first implant region 246 and the second implant region 256. This metal layer can comprise, for example, titanium nitride, tantalum nitride or any other suitable metal layer that will similarly allow charge carriers from the implant regions to recombine readily. It will be appreciated that increasing the recombination rate at the junction allows current to pass essentially freely through the gate-to-body tunnel current region 236 into the channel region 206.

A gate structure 207 can traverse the center portion 215 of the semiconductor layer 205 and, specifically, can traverse both the gate-to-body tunnel current region 236 and the channel region 206. This gate structure can comprise a gate dielectric layer 217 on the top surface 235 of the semiconductor layer 205 and a gate conductor layer 227 on the gate dielectric layer 217

Specifically, the gate dielectric layer 217 can be essentially uniform across both the gate-to-body tunnel current region 236 and above the channel region 206. That is, it can comprise the same material and can have essentially the same thickness above both regions 236 and 206. For example, the gate dielectric layer 217 can comprise a uniform layer of silicon dioxide ($SiO_2$) or a uniform layer of any other suitable gate dielectric material. Alternatively, the gate dielectric layer 217 can comprise a first dielectric section 217.1 on the second implant region 266 and on the enhanced generation and recombination region 256 of the gate-to-body tunnel current region 236 and a second dielectric section 217.2, different from the first dielectric section 217.1, on the first implant region 246 of the gate-to-body tunnel current region and the channel region 206. In this case, the first and second dielectric sections 217.1-217.2 can comprise different dielectric materials with different dielectric constants and/or can have different thicknesses so that the first dielectric section 217.1 is "leakier" than the second dielectric section 217.2. For example, the first dielectric section 217.1 can comprise a dielectric material with a lower dielectric constant than the dielectric material used for the second dielectric section 217.2 and/or the first dielectric section 217.1 can be thinner than the second dielectric section 217.2.

The gate conductor layer 227 can have the second conductivity type and can be positioned on the gate dielectric layer 217 above both the gate-to-body tunnel current region 236 and the channel region 206. For example, the gate conductor layer 227 can comprise a polysilicon gate conductor layer doped with a second conductivity type dopant such that it has the second conductivity type. For example, in an NFET, the polysilicon gate conductor layer can be doped with an N-type dopant. For a PFET, the polysilicon gate conductor layer can be doped with a P-type dopant. Alternatively, the gate conductor layer can comprise a metal gate conductor layer having the appropriate work function (i.e., energy band). For example, for an NFET, the metal gate conductor layer can comprise a metal material near the conduction band for silicon. For a PFET, the metal gate conductor layer can comprise a metal material near the valence band for silicon.

In operation, channel inversion in the gate-to-body tunnel current region 236 is inhibited by both the relatively high first conductivity type doping of the first implant region 246 and the second conductivity type doping of the second implant region 256. In the case of an NFET, this second implant region 256 functions essentially as an electron region 136, which is isolated from the inversion region by first implant region 246 and which is heavily p-type doped. Contrarily, in the case of a PFET, this second implant region 256 functions essentially as a hole-tunnel region, which is isolated from the inversion region by first implant region 246 and which would is heavily N-doped. The generation and recombination region 266 allows current to flow essentially freely from the second implant region 256 into the first implant region 246 and, thereby into the body 226 of the PDSOIFET 200 to reduce the threshold voltage. Consequently, a PDSOIFET 200, as described above, is ideal for incorporation into a circuit, such as an static random access memory (SRAM) array, in which some FET (e.g., pull-down FETs of an SRAM cell) require a lower threshold voltage than others (e.g., pass-gate and pull-up FETs of an SRAM cell).

It should be noted that the PDSOIFET 200, as described above and illustrated in FIGS. 10-12, may comprise any number of additional features that are not described above. These features can include, but are not limited to, source/drain extension regions 210, halo regions, stress layers, gate sidewall spacers 257, metal silicide layers 208, etc. Such FET features are well-known in the art and are, thus, omitted from this specification in order to allow the reader to focus on the salient aspects of the invention.

Figure 13:
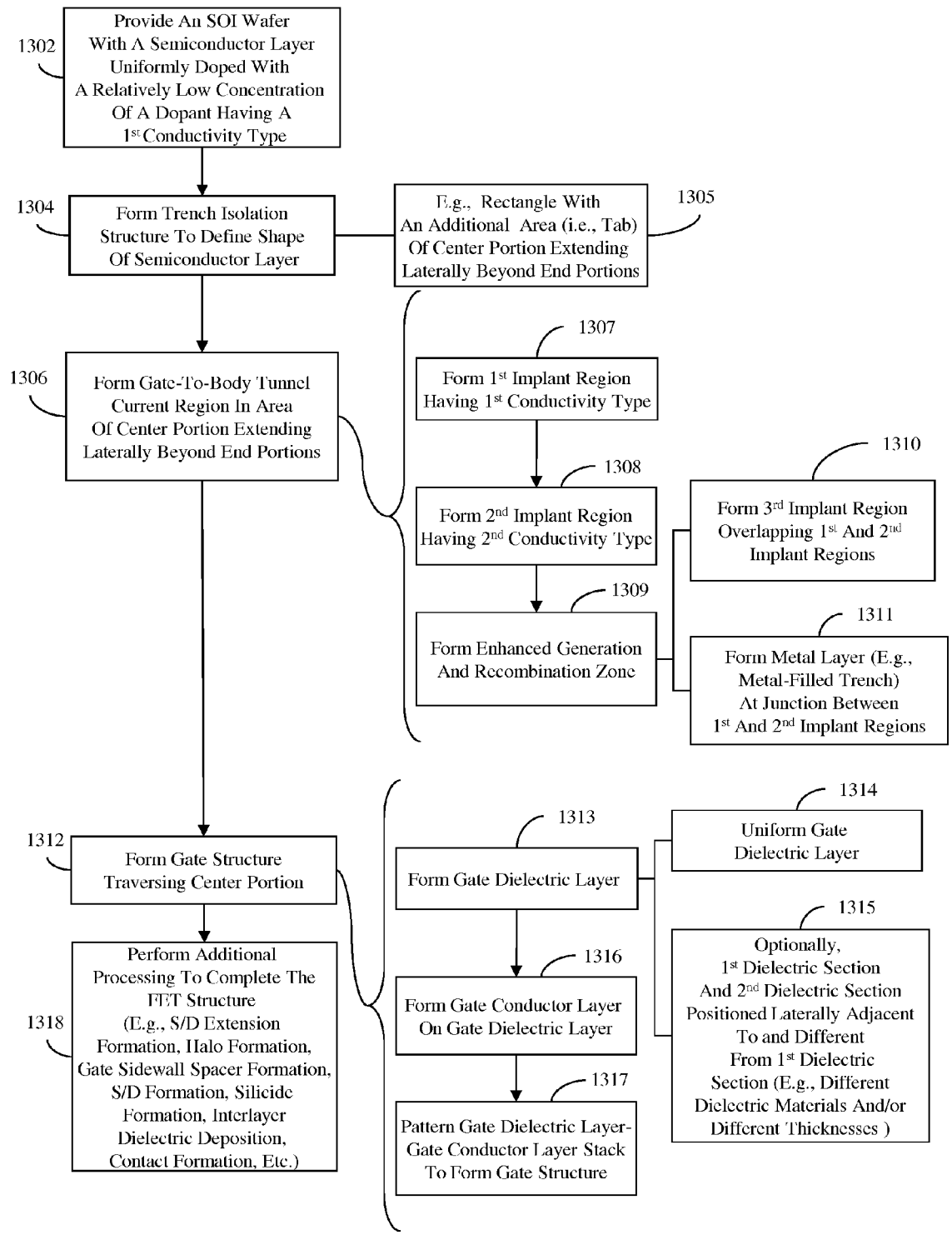
FIG. 13 is a flow diagram illustrating an embodiment of a method of forming the PDSOIFET structure of FIGS. 10-12.
Figure 14:
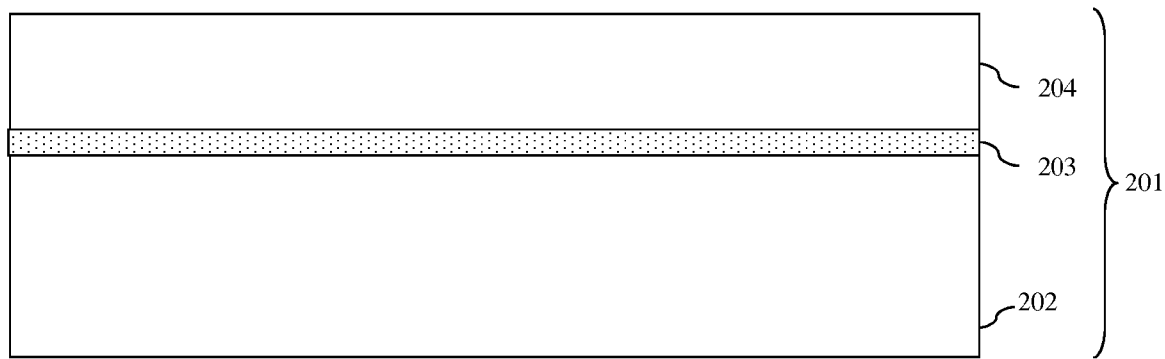
FIG. 14 is a cross-section diagram illustrating a partially completed structure formed according to the method of FIG. 10.

Referring to FIG. 13, an embodiment of a method of forming the above-described PDSOIFET structure 200 can comprise providing a semiconductor-on-insulator (SOI) wafer 201 comprising a semiconductor substrate 202 (e.g., a silicon substrate or other semiconductor substrate) (1302, see FIG. 14). The SOI wafer 201 can further comprise an insulator layer 203 (e.g., a silicon oxide layer or other suitable insulator layer) on the substrate 202 and a semiconductor layer 205 on the insulator layer 203. This semiconductor layer 205 can comprise a single crystalline silicon layer or other suitable semiconductor layer essentially uniformly doped with a relatively low concentration of a first conductivity type dopant such that initially the semiconductor layer 205 has a first conductivity type.

Figure 15:
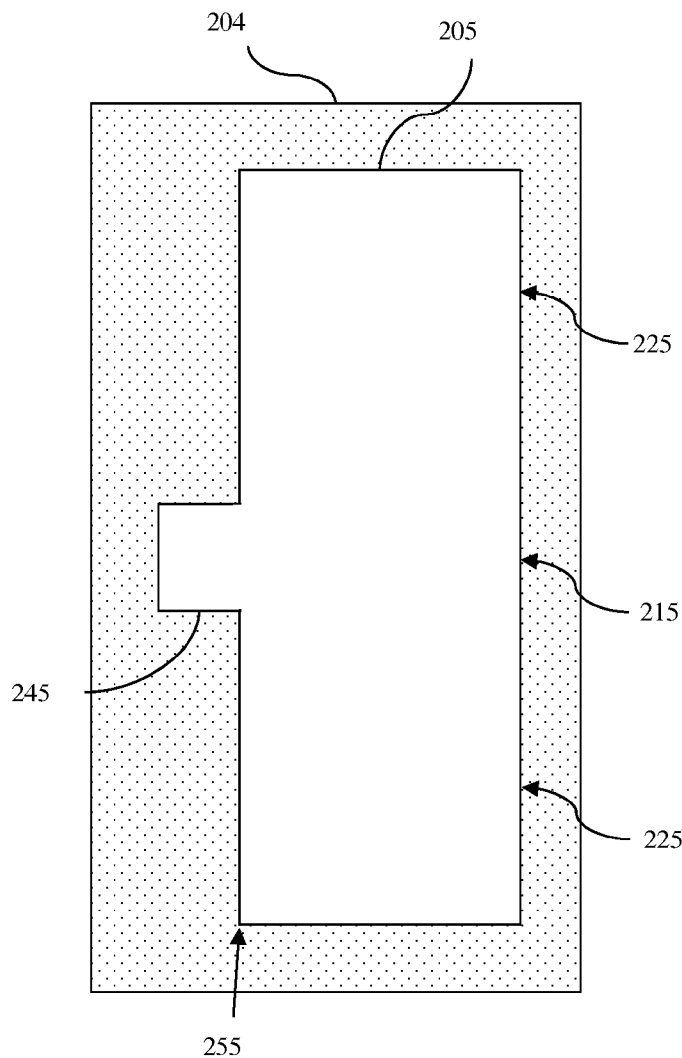
FIG. 15 is a cross-section diagram illustrating a partially completed structure formed according to the method of FIG. 10.

A trench isolation structure 204 can be formed that extends vertically through the semiconductor layer 205 to the insulator layer 203 in order to define the shape of the semiconductor layer 205 (i.e., to define the shape of the active region of the field effect transistor 200) and electrically isolate the field effect transistor 200 from other devices on the wafer 201 (1304). The trench isolation structure 204 can be formed, for example, using conventional shallow trench isolation (STI) formation techniques. That is, a trench can be formed (e.g., using lithographic patterning techniques) and, then, filled with one or more isolation materials (e.g., a silicon oxide, silicon nitride, silicon oxynitride, etc.). The shape of the semiconductor layer 205, as defined by the trench isolation structure 104, can be essentially rectangular shape with end portions 225 and a center portion 215 between the end portions. The shape of the semiconductor layer 205, however, can further be defined such that an additional area 245 (e.g., a tab, extension, etc.) of the center portion 215 extends laterally beyond the end portions 225 (i.e., extending laterally beyond the sidewall 255) (1306, see FIG. 15).

Figure 16:
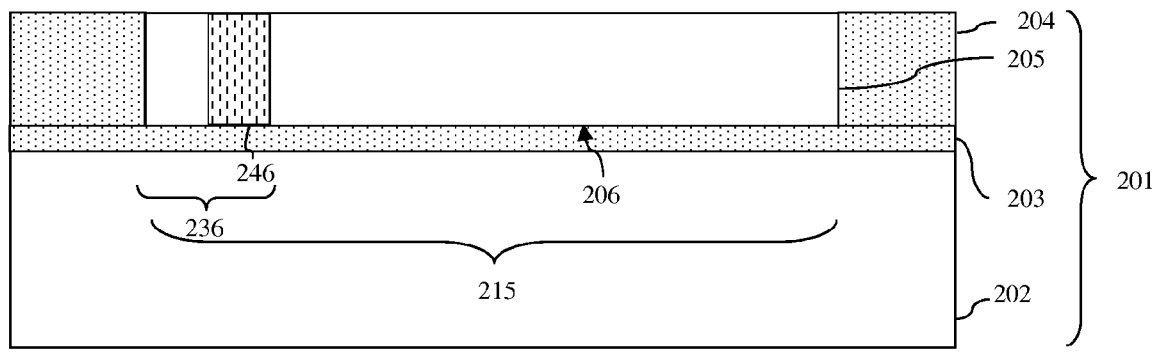
FIG. 16 is a cross-section diagram illustrating a partially completed structure formed according to the method of FIG. 10.
Figure 17:
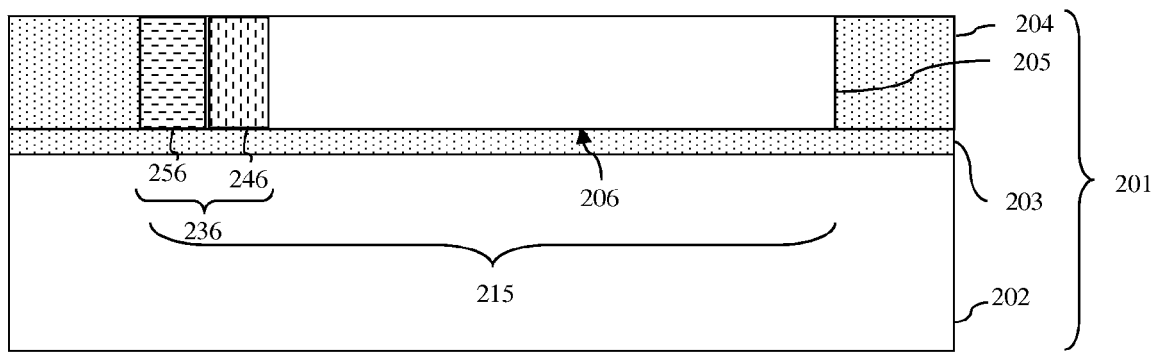
FIG. 17 is a cross-section diagram illustrating a partially completed structure formed according to the method of FIG. 10.
Figure 18:
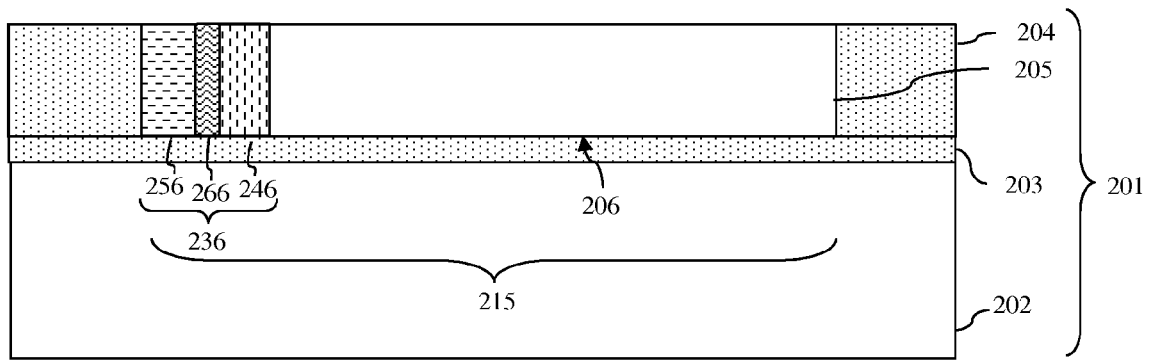
FIG. 18 is a cross-section diagram illustrating a partially completed structure formed according to the method of FIG. 10.
Figure 19:
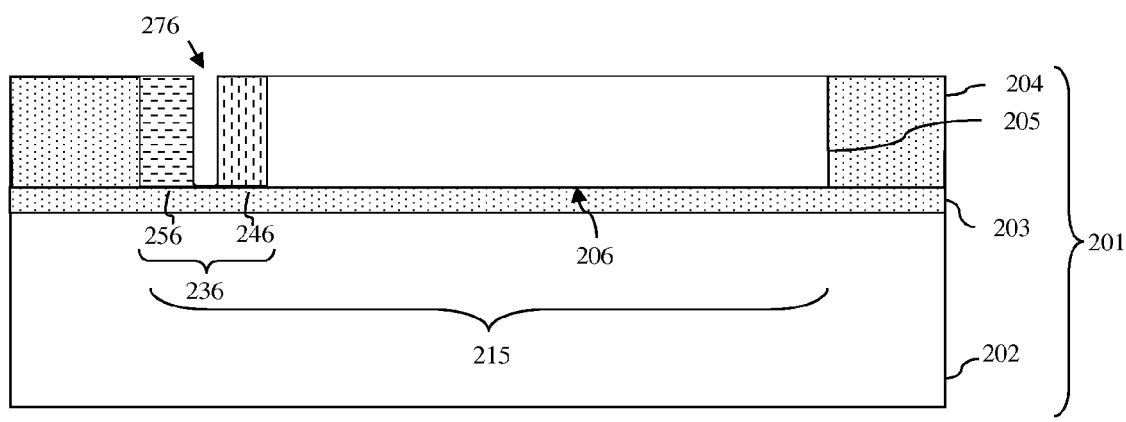
FIG. 19 is a cross-section diagram illustrating a partially completed structure formed according to the method of FIG. 10.
Figure 20:
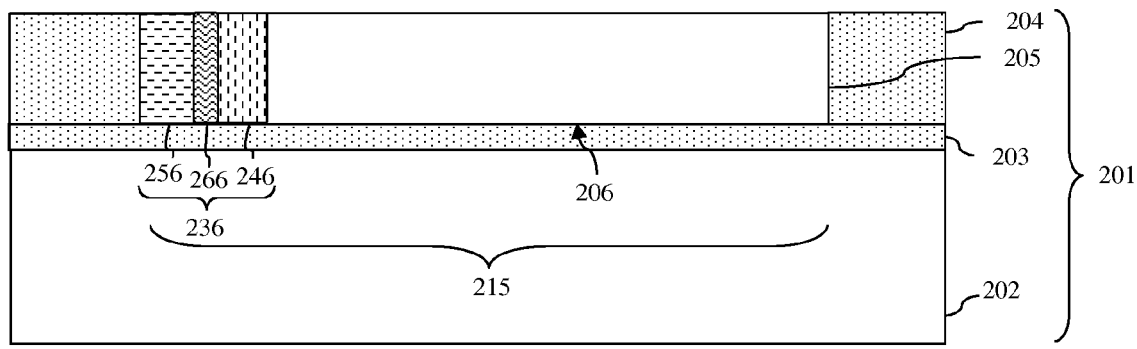
FIG. 20 is a cross-section diagram illustrating a partially completed structure formed according to the method of FIG. 10.

Next, a gate-to-body tunnel current region 236 can be formed in the area 245 of the center portion 215 that extends laterally beyond the end portions 225. Specifically, using a masked ion implantation process, a first implant region 246 can be formed within this area 245 and, specifically, immediately adjacent to a designated channel region 206 that is in the center portion 215 between the end portions 225 (1307, see FIG. 16). This first implant region 246 can be formed such that it is doped with the first conductivity type dopant at a higher concentration than the channel region 206. Additionally, also using a masked ion implantation process, a second implant region 256 can be formed adjacent to the first implant region 246 (1308, see FIG. 17). This second implant region 256 can be formed such that it is doped with a second conductivity type dopant different from the first conductivity type dopant such that the second implant region 256 has a second conductivity type different from the first conductivity type. Finally, an enhanced generation and recombination region 266 can be formed at the junction between the first implant region 246 and the second implant region 256 (1309). For example, again using a masked ion implantation process, a third implant region can be formed such that it overlaps the first and second implant regions 246, 256 (1310, see FIG. 18). This third implant region can be doped with ions of xenon, germanium, gold, platinum, oxygen, neon, argon, krypton or any other material suitable for damaging the junction between the first and second implant regions 246 and 256 so as to allow charge carriers from those implant regions to recombine readily. Alternatively, the enhanced generation and recombination region 266 can be formed by first etching an opening 276 in the semiconductor layer 205 and, particularly, extending vertically through the junction between the first and second implant regions 246, 256 (see FIG. 19). This opening 276 can then be filled with a metal layer (e.g., a titanium nitride layer, a tantalum nitride layer or any other suitable metal layer that will similarly allow charge carriers from the implant regions to recombine readily) (1311, see FIG. 20). It will be appreciated that increasing the recombination rate at the junction allows current to pass essentially freely through the gate-to-body tunnel current region 236 into the channel region 206.

Once the gate-to-body tunnel current region 236 is formed, a gate structure 207 can be formed that traverses the center portion 215 of the semiconductor layer 205 and, specifically, that traverses both the gate-to-body tunnel current region 236 and the channel region 206 (1312, see FIGS. 10-11). For example, a gate dielectric layer 217 can be formed on the top surface of the semiconductor layer 205 (1313). Then, a gate conductor layer 227 can be formed on the gate dielectric layer 217 (1316). Finally, the gate dielectric layer-gate conductor layer stack can be patterned, e.g., using conventional lithographic patterning techniques, in order to form the gate structure 207 that traverses the center portion 215 of the semiconductor layer 205 (1317).

Specifically, at process 1313, the gate dielectric layer 217 can be formed (e.g., deposited) such that it is essentially uniform (i.e., such that it has the same thickness and comprises the same material) across the entire center portion 215 (1314). For example, a uniform layer of silicon dioxide (SiO$_2$) or any other suitable gate dielectric material can be deposited onto the top surface 235 of the semiconductor layer 205. Alternatively, the gate dielectric layer 217 can be formed (e.g., using multiple masked deposition processes) such that it comprises a first dielectric section 217.1 over the second implant region 256 and enhanced generation and recombination region 266 of the gate-to-body tunnel current region 236 within the center portion 215 of the semiconductor layer 205 and a second dielectric section 217.2, different from the first dielectric section 217.1, over the first implant region 246 of the gate-to-body tunnel current region 236 and the channel region 206 within the center portion 215 of the semiconductor layer 205 (1315). In this case, the first and second dielectric sections 217.1-217.2 can be formed such that they comprise different dielectric materials with different dielectric constants and/or such that they have different thicknesses so that the first dielectric section 217.1 is "leakier" than the second dielectric section 217.2. For example, the first dielectric section 217.1 can be formed with a dielectric material that has a lower dielectric constant than the dielectric material used to form the second dielectric section 217.2 and/or the first dielectric section 217.1 can be formed such that it is thinner than the second dielectric section 217.2.

At process 1316, the gate conductor layer 227 can be formed such that it has the second conductivity type and such that it is positioned on the gate dielectric layer 217 above both the gate-to-body tunnel current region 236 and the channel region 206. For example, a polysilicon gate conductor layer can be deposited and doped (e.g., either in-situ or subsequently) with a second conductivity type dopant such that it has the second conductivity type. For example, in an NFET, a polysilicon gate conductor layer can be doped with an N-type dopant. For a PFET, a polysilicon gate conductor layer can be doped with a P-type dopant. Alternatively, a metal gate conductor layer, which has the appropriate work function (i.e., energy band); can be formed on the gate dielectric layer. For example, for an NFET, the metal gate conductor layer can comprise a metal material near the conduction band for silicon. For a PFET, the metal gate conductor layer can comprise a metal material near the valence band for silicon.

After the gate structure is formed at process 1312, various additional processes can be performed in order to complete the FET structure (1318, see FIG. 10). These additional processes can include, but are not limited to, forming second conductivity type source/drain extension regions 210 adjacent to the channel region 206, forming first conductivity type halo regions between the source/drain extension regions and the channel region 206, forming gate sidewall spacers 257, forming second conductivity type source/drain regions 209 within the end portions 225 of the semiconductor layer 205, forming a metal silicide layer 208 on the gate conductor layer 227 and source/drain regions 209, depositing an interlayer dielectric material, forming contacts, etc.

The method as described above is used in the fabrication of integrated circuit chips and such integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. Additionally, terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It should further be understood that corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments of the present invention as set forth above were chosen and described in order to best explain the principles of the invention and the practical application, and to enable others of ordinary skill in the art to understand the invention for various embodiments with various modifications as are suited to the particular use contemplated.

Therefore, disclosed above are embodiments of a floating body partially depleted semiconductor-on-insulator field effect transistor (PDSOIFET) structure having a gate-to-body tunnel current region that provides for threshold voltage (Vt) lowering without increasing gate current or other leakage currents. In one embodiment, a semiconductor layer has a center portion with a first conductivity type. A gate structure traverses the center portion. This gate structure has adjacent sections with different conductivity types in order to create, within the center portion of the semiconductor layer, a channel region below one section and a gate-to-body tunnel current region below another section. In another embodiment, a semiconductor layer has a center portion with a channel region and a gate-to-body tunnel current region adjacent to the channel region. The channel region is doped with a dopant having a first conductivity type. The gate-to-body tunnel current region comprises: a first implant region immediately adjacent to the channel region and doped with a higher concentration of the same dopant; a second implant region adjacent to the first implant region and having a second conductivity type; and an enhanced generation and recombination region between the first and second implant regions. A gate structure with the second conductivity type traverses the center portion. The PDSOIFET structure embodiments can, for example, be incorporated into any electronic circuit with some FETs requiring a lower threshold voltage than others (e.g., in an Static Random Access Memory (SRAM) array, where pull-down FETs require a lower threshold voltage that pass-gate or pull-up FETs). Also disclosed herein are embodiments of methods of forming these structures.

What is claimed is:

1. A field effect transistor structure comprising:
    a semiconductor layer having end portions and a center portion between said end portions, said center portion having an area that extends laterally beyond said end portions and said center portion comprising:
        a channel region between said end portions, said channel region being doped with a first conductivity type dopant such that said channel region has a first conductivity type; and
        a gate-to-body tunnel current region in said area that extends laterally beyond said end portions, said gate-to-body tunnel current region comprising:
            a first implant region immediately adjacent to said channel region and doped with said first conductivity type dopant at a higher concentration than said channel region;
            a second implant region adjacent to said first implant region and doped with a second conductivity type dopant different from said first conductivity type dopant such that said second implant region has a second conductivity type different from said first conductivity type; and
            an enhanced generation and recombination region at a junction between said first implant region and said second implant region; and
    a gate structure traversing said center portion.

2. The field effect transistor of claim 1, said enhanced generation and recombination region comprising a third implant region overlapping said first implant region and said second implant region.

3. The field effect transistor of claim 1, said enhanced generation and recombination region comprising a metal layer extending vertically between said first implant region and said second implant region.

4. The field effect transistor structure of claim 1, said gate structure comprising: a gate dielectric layer on a top surface of said semiconductor layer, said gate dielectric layer comprising:
    a first dielectric section above said second implant region and said enhanced generation and recombination region of said gate-to-body tunnel current region; and
    a second dielectric section above said first implant region of said gate-to-body tunnel current region and above said channel region, said first dielectric section and said second dielectric section having any of different thicknesses and different dielectric constants.

5. The field effect transistor structure of claim 4, said gate structure comprising a gate conductor layer above said gate dielectric layer.

6. The field effect transistor structure of claim 5, said gate conductor layer comprising any one of a doped polysilicon gate conductor layer and a metal gate conductor layer.

7. The field effect transistor of claim 1, further comprising a trench isolation structure laterally surrounding said semiconductor layer such that said trench isolation structure is positioned laterally immediately adjacent to three sides of said area that extends laterally beyond said end portions.

8. A field effect transistor structure comprising:
    a semiconductor layer having end portions and a center portion between said end portions, said center portion having an area that extends laterally beyond said end portions and said center portion comprising:
        a channel region between said end portions, said channel region being doped with a first conductivity type dopant such that said channel region has a first conductivity type; and
        a gate-to-body tunnel current region in said area that extends laterally beyond said end portions, said gate-to-body tunnel current region comprising:
            a first implant region immediately adjacent to said channel region and doped with said first conductivity type dopant at a higher concentration than said channel region;
            a second implant region adjacent to said first implant region and doped with a second conductivity type dopant different from said first conductivity type dopant such that said second implant region has a second conductivity type different from said first conductivity type; and
            an enhanced generation and recombination region at a junction between said first implant region and said second implant region; and
    a gate structure traversing said center portion, said gate structure comprising:

a gate dielectric layer on said semiconductor layer above said channel region and said gate-to-body tunnel current region; and,
a gate conductor layer on said gate dielectric layer.

9. The field effect transistor of claim 8, said enhanced generation and recombination region comprising a third implant region overlapping said first implant region and said second implant region.

10. The field effect transistor of claim 8, said enhanced generation and recombination region comprising a metal layer extending vertically between said first implant region and said second implant region.

11. The field effect transistor of claim 8, said gate dielectric layer comprising:
a first dielectric section above said second implant region and said enhanced generation and recombination region of said gate-to-body tunnel current region; and
a second dielectric section above said first implant region of said gate-to-body tunnel current region and above said channel region, said first dielectric section and said second dielectric section having any of different thicknesses and different dielectric constants.

12. The field effect transistor of claim 11, said first dielectric section having a lower dielectric constant and being thinner than said second dielectric section.

13. The field effect transistor of claim 8, further comprising a trench isolation structure laterally surrounding said semiconductor layer such that said trench isolation structure is positioned laterally immediately adjacent to three sides of said area that extends laterally beyond said end portions.

14. A method of forming a field effect transistor structure, said method comprising:
providing a semiconductor layer doped with a first conductivity type dopant such that said semiconductor layer has said first conductivity type, said semiconductor layer further having end portions and a center portion between said end portions, and said center portion having an area that extends laterally beyond said end portions;
forming a gate-to-body tunnel current region in said area that extends laterally beyond said end portions, said forming of said gate-to-body tunnel current region comprising:
forming a first implant region in said area immediately adjacent to a designated channel region in said center portion between said end portions, said first implant region being doped with said first conductivity type dopant at a higher concentration than said channel region;
forming a second implant region adjacent to said first implant region, said second implant region being doped with a second conductivity type dopant different from said first conductivity type dopant such that said second implant region has a second conductivity type different from said first conductivity type; and
forming an enhanced generation and recombination region at a junction between said first implant region and said second implant region; and
forming a gate structure traversing said center portion.

15. The method of claim 14, said forming of said enhanced generation and recombination region comprising forming a third implant region overlapping said first implant region and said second implant region.

16. The method of claim 14, said forming of said enhanced generation and recombination region comprising:
after said forming of said first implant region and said second implant region, forming an opening in said semiconductor layer extending vertically through said junction between said first implant region and said second implant region; and
forming a metal layer in said opening.

17. The method of claim 14, said forming of said gate structure comprising forming a gate dielectric layer on a top surface of said semiconductor layer, said forming of said gate dielectric layer comprising:
forming a first dielectric section above said second implant region and said enhanced generation and recombination region of said gate-to-body tunnel current region; and
forming a second dielectric section above said first implant region of said gate-to-body tunnel current region and above said channel region, said first dielectric section being different from said second dielectric section.

18. The method of claim 17, said first dielectric section and said second dielectric section being formed so as to have any of different thicknesses and different dielectric constants.

19. The method of claim 17, said forming of said gate structure comprising forming a gate conductor layer on said gate dielectric layer.

20. The method of claim 19, said gate conductor layer comprising any of a doped polysilicon gate conductor layer and a metal gate conductor layer.

* * * * *